(12) United States Patent
Ishii et al.

(10) Patent No.: US 7,925,127 B2
(45) Date of Patent: Apr. 12, 2011

(54) SUSPENSION BOARD WITH CIRCUIT AND PRODUCING METHOD THEREOF

(75) Inventors: Jun Ishii, Osaka (JP); Hitoki Kanagawa, Osaka (JP); Toshiki Naito, Osaka (JP)

(73) Assignee: Nitto Denko Corporation, Osaka (JP)

( * ) Notice: Subject to any disclaimer, the term of this patent is extended or adjusted under 35 U.S.C. 154(b) by 129 days.

(21) Appl. No.: 12/457,430

(22) Filed: Jun. 10, 2009

(65) Prior Publication Data

US 2009/0310909 A1 Dec. 17, 2009

Related U.S. Application Data

(60) Provisional application No. 61/129,386, filed on Jun. 23, 2008.

(30) Foreign Application Priority Data

Jun. 11, 2008 (JP) .................................. 2008-152657

(51) Int. Cl.
*G02B 6/12* (2006.01)

(52) U.S. Cl. ................................ 385/14; 385/15; 385/31

(58) Field of Classification Search .................... 385/14, 385/15, 31, 49, 52, 53, 88, 89, 92, 129–132, 385/141, 147; 29/829; 174/250; 427/123, 427/163.2

See application file for complete search history.

(56) References Cited

U.S. PATENT DOCUMENTS

2006/0187564 A1  8/2006  Sato et al.
2008/0115962 A1* 5/2008  Juni et al. ...................... 174/250

FOREIGN PATENT DOCUMENTS

JP  2006-185548  7/2006

* cited by examiner

*Primary Examiner* — Ellen Kim
(74) *Attorney, Agent, or Firm* — Jean C. Edwards, Esq.; Akerman Senterfitt LLP

(57) ABSTRACT

A suspension board with circuit includes a circuit board formed with an opening, and having a mounting portion defined by the opening for mounting thereon a slider on which a magnetic head is mounted, and an optical waveguide disposed on the circuit board so as to traverse the opening. The optical waveguide is slack in the opening.

3 Claims, 15 Drawing Sheets

(a)

(b)

(c)

(d)

(e)

US 7,925,127 B2

SUSPENSION BOARD WITH CIRCUIT AND PRODUCING METHOD THEREOF

CROSS-REFERENCE TO RELATED APPLICATIONS

This patent application claims the benefit of U.S. Provisional Application No. 61/129,386, filed on Jun. 23, 2008, and claims priority from Japanese Patent Application No. 2008-152657, filed on Jun. 11, 2008, the contents of which are herein incorporated by reference in their entirety.

BACKGROUND OF THE INVENTION

1. Field of the Invention

The present invention relates to a suspension board with circuit and a producing method thereof and, more particularly, to a suspension board with circuit in which a optically assisted method is used and a producing method thereof.

2. Description of the Related Art

As a method of magnetic recording to a hard disk or the like, a optically assisted method (a thermally assisted magnetic recording method or a thermally assisted recording method) has been known in recent years.

For example, a thermally assisted magnetic recording head has been proposed which includes a suspension, and an optical waveguide (second optical waveguide) provided thereon (see, e.g., Japanese Unexamined Patent Publication No. 2006-185548 (FIG. 9)).

SUMMARY OF THE INVENTION

As shown in FIG. 19, in a suspension board with circuit 50 provided with an optical waveguide 60, a conductive pattern 53 having signal wires 55 is provided.

In the suspension board with circuit 50, a gimbal portion 57 is provided at one longitudinal end portion. In the gimbal portion 57, a slit portion 58 is bored to extend through the suspension board with circuit 50 in a thickness direction. The slit portion 58 is formed in a generally U-shaped shape which opens toward one longitudinal side when viewed in plan view. In the gimbal portion 58, a tongue portion 59 is formed to be widthwise interposed between the two end portions of the slit portion 58.

Further, in the suspension board with circuit 50, a head slider (not shown) with a magnetic head mounted thereon is mounted on the tongue portion 59, and the tongue portion 59 is bent at an appropriate angle. As a result, in accordance with the bend angle, the magnetic head is maintained at a predetermined angle with respect to a magnetic disk (not shown).

Furthermore, in the suspension board with circuit 50, the optical waveguide 60 and the signal wires 55 are each routed in the gimbal portion 57 so as to pass around the slit portion 58, and pass through a region located widthwise outside the slit portion 58.

However, when the optical waveguide 60 is routed as described above, the problem of an increased loss in optical signal occurs due to the bend or the like. Accordingly, when the optical waveguide 60 is disposed to traverse the slit portion 58 in the gimbal portion 57, the optical waveguide 60 can be disposed in a generally linear shape, and therefore the loss in optical signal can be reduced.

However, when the optical waveguide 60 is disposed in a generally linear shape, tension resulting from the bend of the tongue portion 59 is placed on the optical waveguide 60 in the slit portion 58 to cause a problem that the optical waveguide 60 is cut, or the tongue portion 59 cannot be smoothly bent.

It is therefore an object of the present invention to provide a suspension board with circuit having excellent connection reliability in which an optical waveguide is disposed in a simplified shape to allow a reduction in optical signal loss in the optical waveguide, and a producing method thereof.

A suspension board with circuit of the present invention includes a circuit board formed with an opening, and having a mounting portion defined by the opening for mounting thereon a slider on which a magnetic head is mounted, and an optical waveguide disposed on the circuit board so as to traverse the opening, wherein the optical waveguide is slack in the opening.

In the suspension board with circuit, the slider on which the magnetic head is mounted is mounted on the mounting portion, and the mounting portion is bent to maintain the magnetic head at a predetermined angle with respect to a magnetic disk.

At this time, with the bending of the mounting portion, the portions of the circuit board which are located on both sides of the opening interposed therebetween are drawn away from each other so that tension in a direction in which they are drawn away from each other is loaded on the optical waveguide in the opening. However, since the optical waveguide in the opening is slack, it can stretch under the load of the tension.

As a result, it is possible to prevent damage to the optical waveguide or a broken wire to provide excellent connection reliability, and smoothly bend the mounting portion to smoothly implement an optically assisted method.

Since the optical waveguide is disposed so as to traverse the opening, the optical waveguide can be disposed in a simplified shape by eliminating the need to route the optical waveguide, and a loss in optical signal can be reduced. As a result, it is possible to reduce the loss in optical signal, while reducing production cost.

In the suspension board with circuit, it is preferable that the circuit board includes locking portions for locking the optical waveguide which are formed on both sides of the opening interposed therebetween, the optical waveguide is provided with respective locked portions to be locked by the respective locking portions, and a distance between the two locking portions formed on both sides of the opening is shorter than a distance between the two locked portions corresponding to the two locking portions.

In the suspension board with circuit, when the distance between the two locking portions formed on both sides of the opening are set shorter than the distance between the two locked portions corresponding to the two locking portions, and the respective locked portions are locked by the respective locking portions, it is possible to easily slacken the optical waveguide between the two locked portions formed on both sides of the opening. This can allow the optical waveguide to be easily and reliably slackened.

A producing method of the suspension board with circuit includes the steps of preparing a circuit board formed with an opening, and having a mounting portion defined by the opening for mounting thereon a slider on which a magnetic head is mounted, preparing an optical waveguide, and disposing the optical waveguide on the circuit board such that the optical waveguide traverses the opening, wherein, in the step of preparing the circuit board, locking portions for locking the optical waveguide are formed on both sides of the opening interposed therebetween, in the step of preparing the optical waveguide, respective locked portions to be locked by the respective locking portions are provided such that a distance between the two locking portions formed on both sides of the opening is shorter than a distance between the two locked portions corresponding to the two locking portions, and, in the step of disposing the optical waveguide, the respective locked portions are locked by the respective locking portions, while the optical waveguide between the two locked portions corresponding to the two locking portions formed on both sides of the opening is slackened.

According to the method, in the step of disposing the optical waveguide, the respective locked portions are locked by the respective locking portions, while the optical waveguide between the two locked portions is slackened. This can allow the optical waveguide to be reliably and easily slackened.

In the obtained suspension board with circuit, the slider on which the magnetic head is mounted is mounted on the mounting portion, and the mounting portion is bent to maintain the magnetic head at a predetermined angle with respect to a magnetic disk.

At that time, with the bending of the mounting portion, the portions of the circuit board which are located on both sides of the opening interposed therebetween are drawn away from each other so that tension in a direction in which they are drawn away from each other is loaded on the optical waveguide in the opening. However, since the optical waveguide in the opening is slack, it can stretch under the load of the tension.

As a result, it is possible to prevent damage to the optical waveguide or a broken wire to provide excellent connection reliability, and smoothly bend the mounting portion to smoothly implement an optically assisted method.

DETAILED DESCRIPTION OF THE INVENTION

Figure 1:
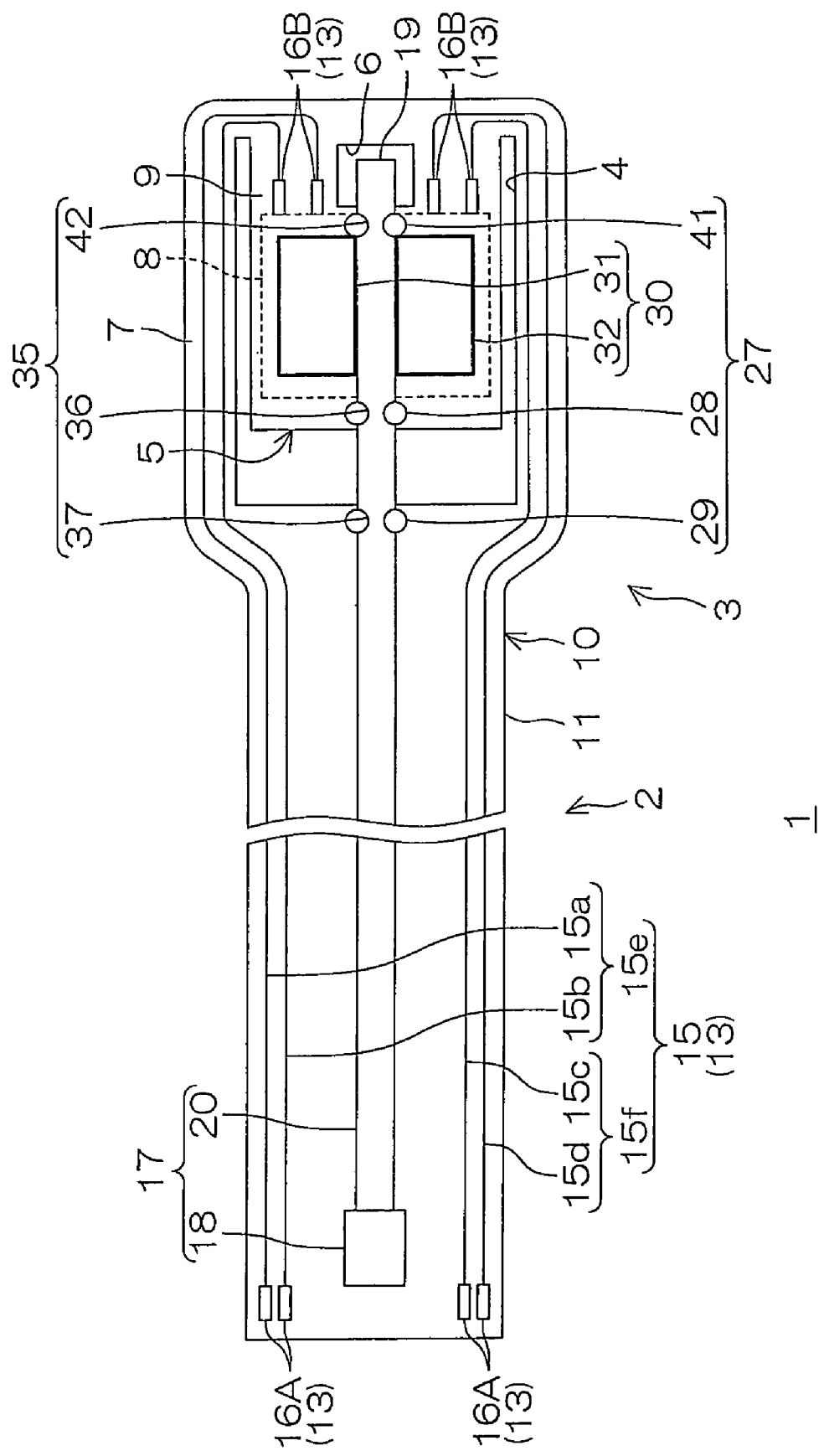
FIG. 1 is a plan view of a suspension board with circuit according to an embodiment of the present invention.
Figure 2:
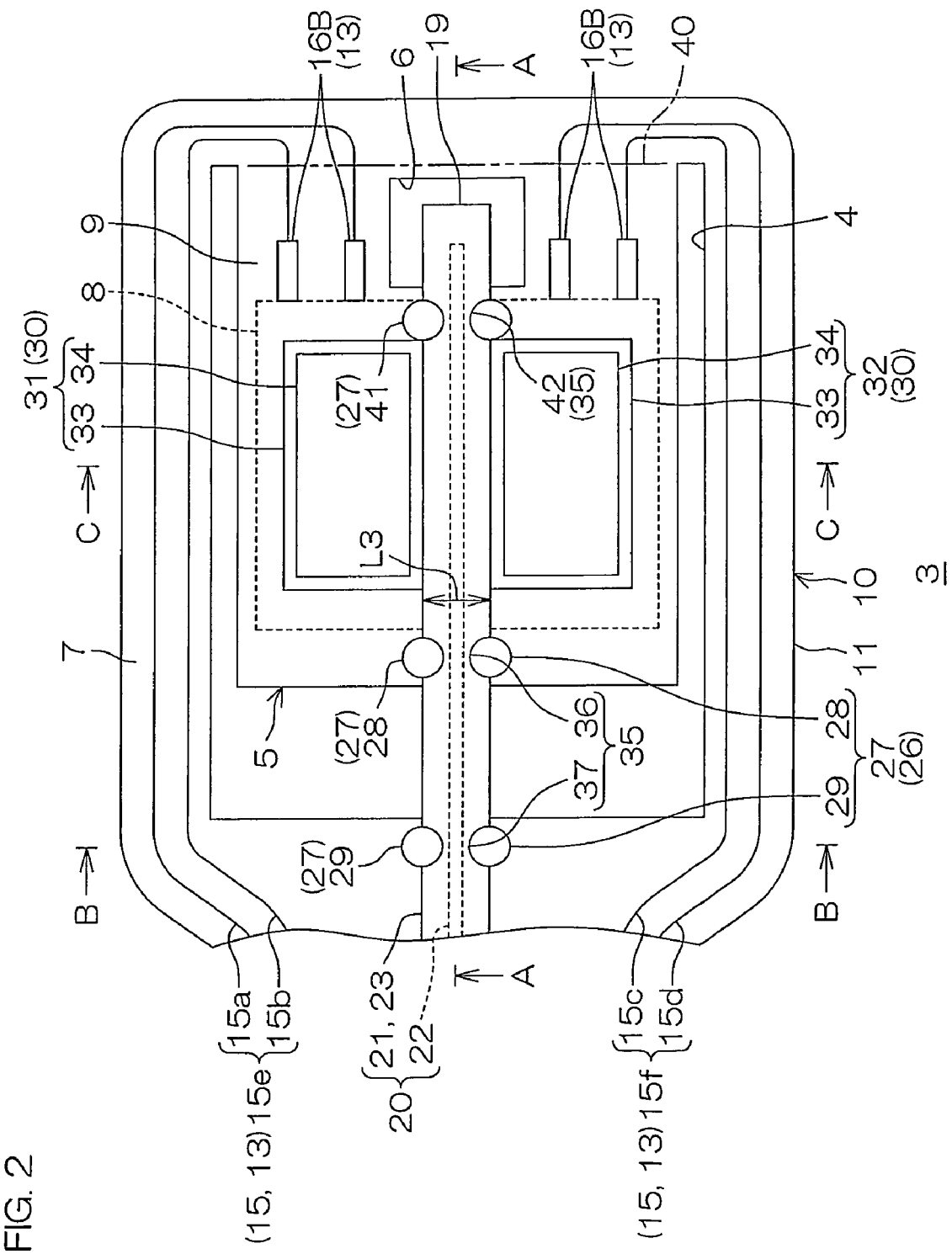
FIG. 2 is an enlarged plan view of a gimbal of the suspension board with circuit shown in FIG. 1.
Figure 3:
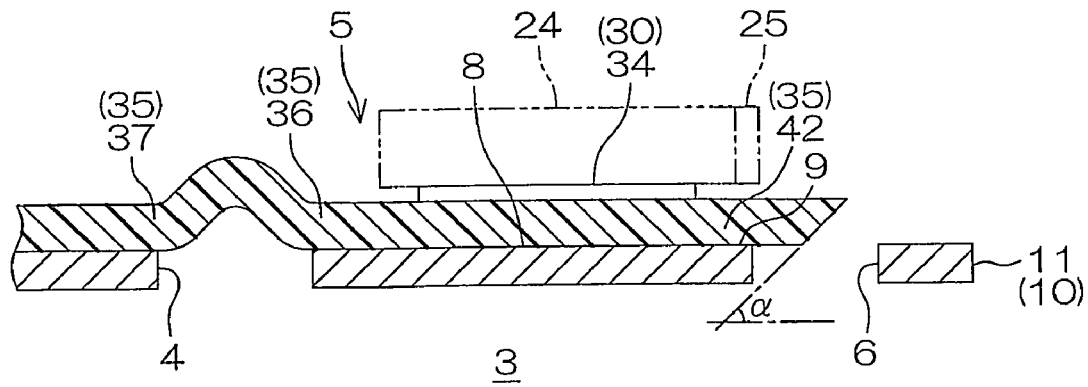
FIG. 3 is a cross-sectional view taken along the line A-A of FIG. 2.

FIG. 1 is a plan view of a suspension board with circuit according to an embodiment of the present invention. FIG. 2 is an enlarged plan view of a gimbal (described later) of the suspension board with circuit shown in FIG. 1. FIG. 3 is a cross-sectional view taken along the line A-A of FIG. 2. FIG.

Figure 4:
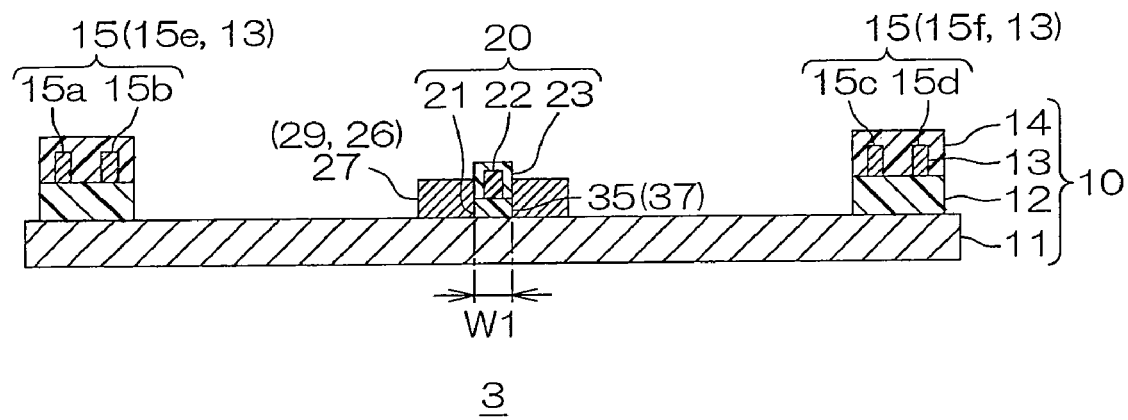
FIG. 4 is a cross-sectional view taken along the line B-B of FIG. 2.
Figure 5:
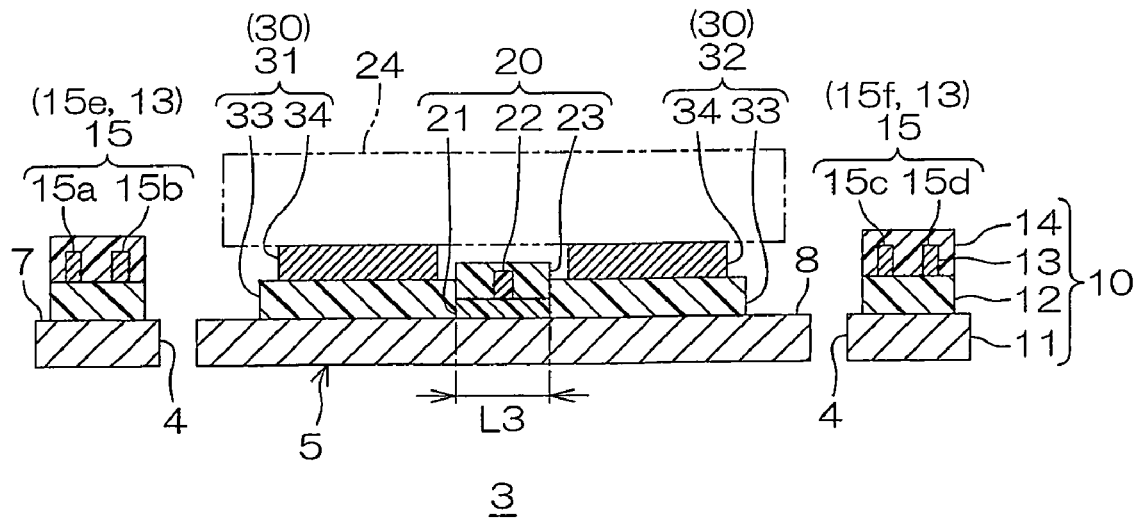
FIG. 5 is a cross-sectional view taken along the line C-C of FIG. 2.
Figure 6:
FIG. 6 is a process view for illustrating a producing method of the suspension board with circuit, which is a cross-sectional view corresponding to FIG. 4,
  (a) showing the step of preparing a metal supporting board,
  (b) showing the step of forming an insulating base layer, a pedestal insulating base layer, and a locking insulating base layer,
  (c) showing the step of forming a conductive pattern and a pedestal conductive layer,
  (d) showing the step of forming an insulating cover layer, and
  (e) showing the step of disposing an optical waveguide on a circuit board.
Figure 6:
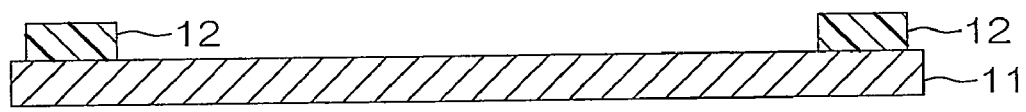
Figure 6:
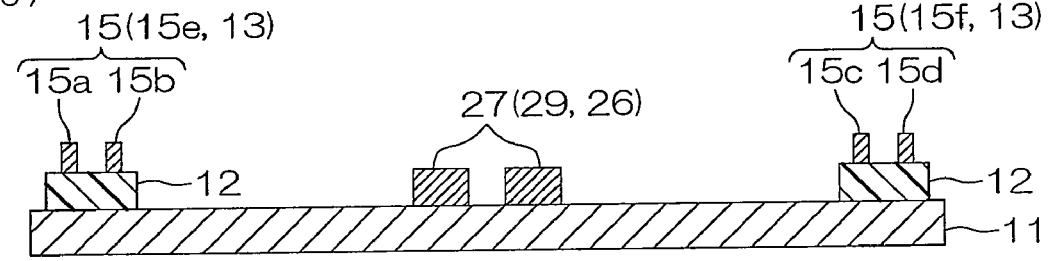
Figure 6:
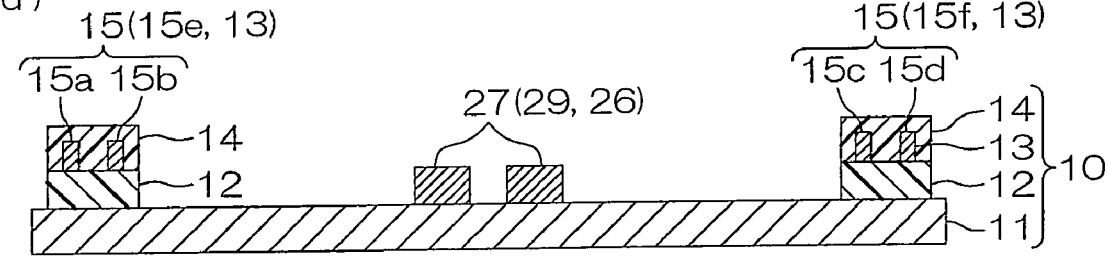
Figure 6:
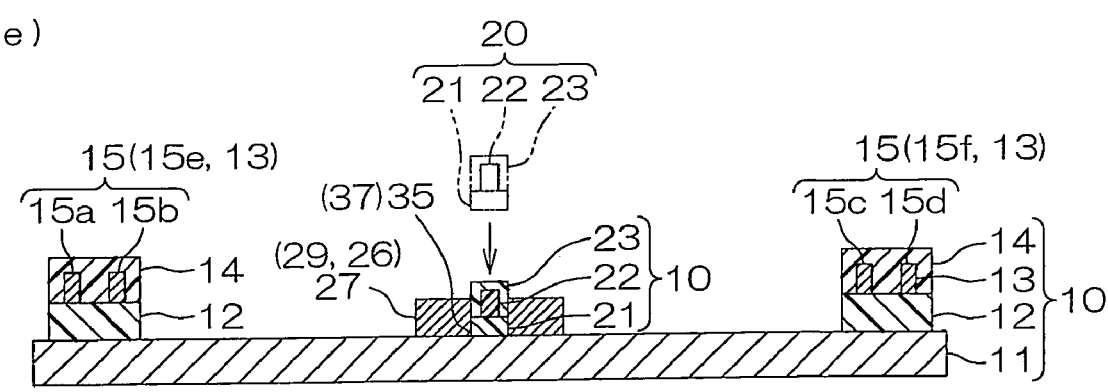
Figure 7:
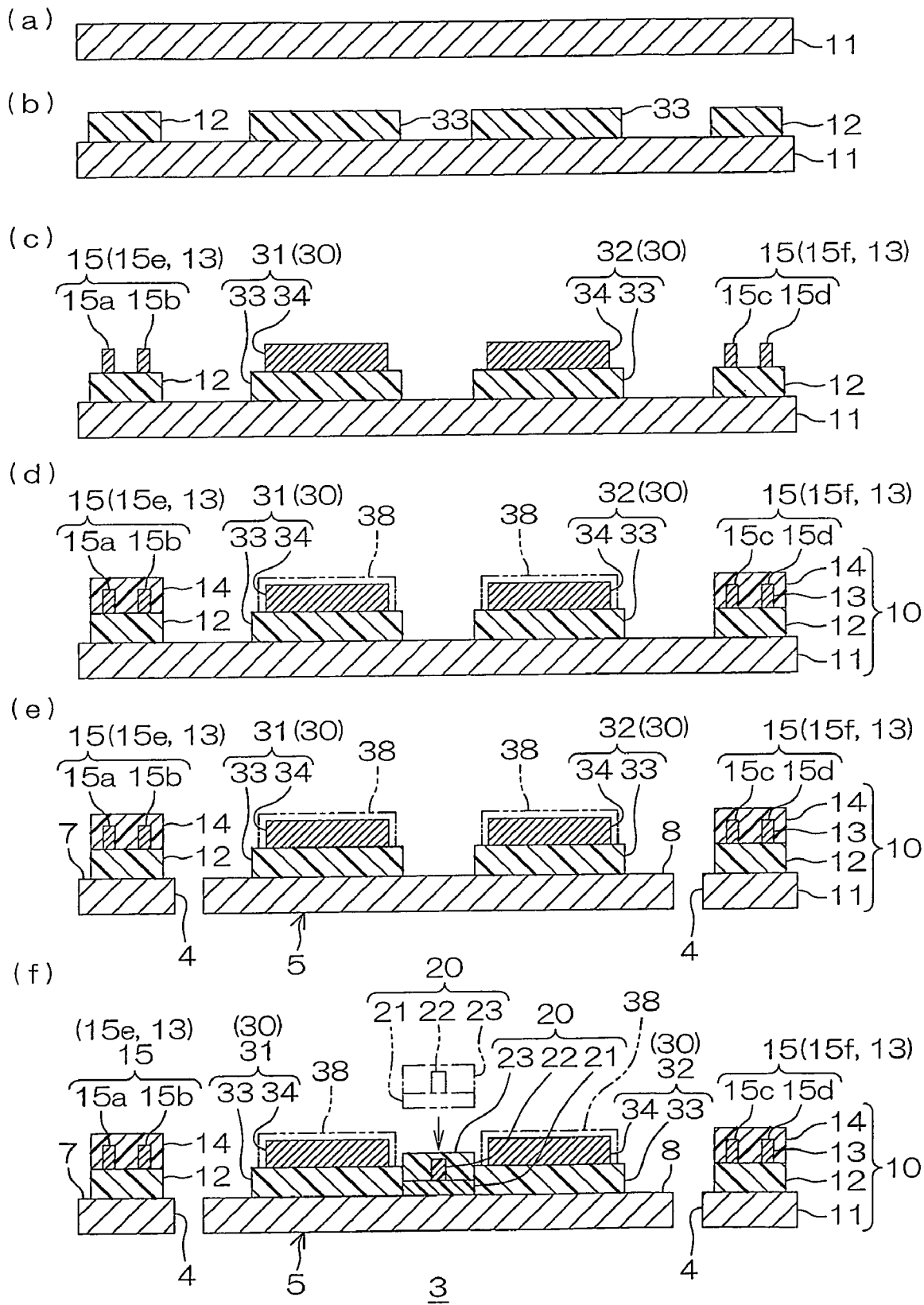
FIG. 7 is a process view for illustrating the producing method of the suspension board with circuit, which is a cross-sectional view corresponding to FIG. 5,
  (a) showing the step of preparing the metal supporting board,
  (b) showing the step of forming the insulating base layer, the pedestal insulating base layer, and the locking insulating base layer,
  (c) showing the step of forming the conductive pattern and the pedestal conductive layer,
  (d) showing the step of forming the insulating cover layer,
  (e) showing the step of forming a slit and an emission opening, and
  (f) showing the step of disposing the optical waveguide on the circuit board.
Figure 8:
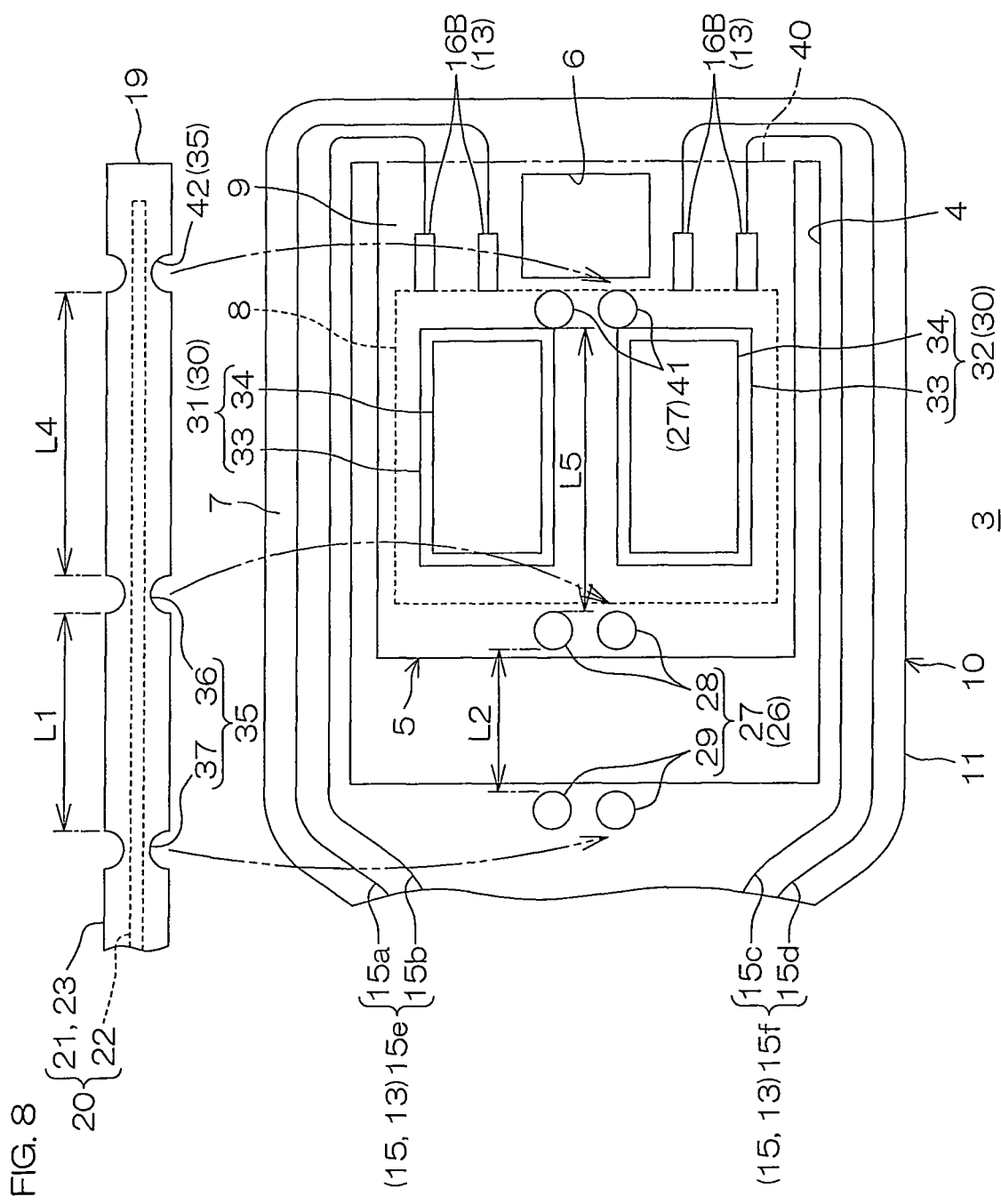
FIG. 8 is a view illustrating a method of disposing the optical waveguide, which is a plan view corresponding to FIG. 2.
Figure 9:
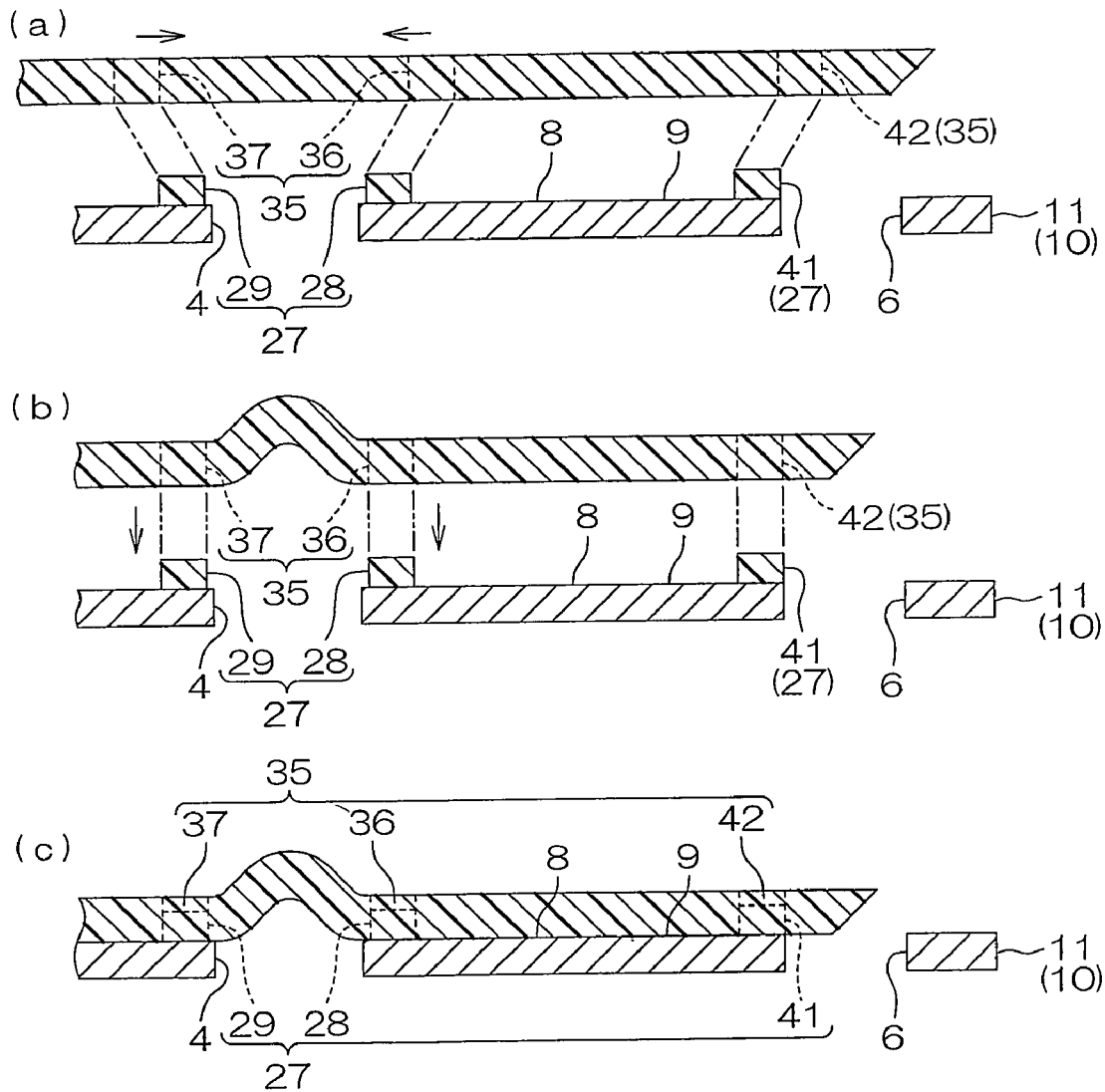
FIG. 9 is a view illustrating the method of disposing the optical wave guide, which is a cross-sectional view corresponding to FIG. 3,
  (a) showing the step of individually preparing the circuit board and the optical waveguide,
  (b) showing the step of slacking the optical waveguide between locked portions, and
  (c) showing the step of disposing the optical waveguide on the circuit board.
Figure 10:
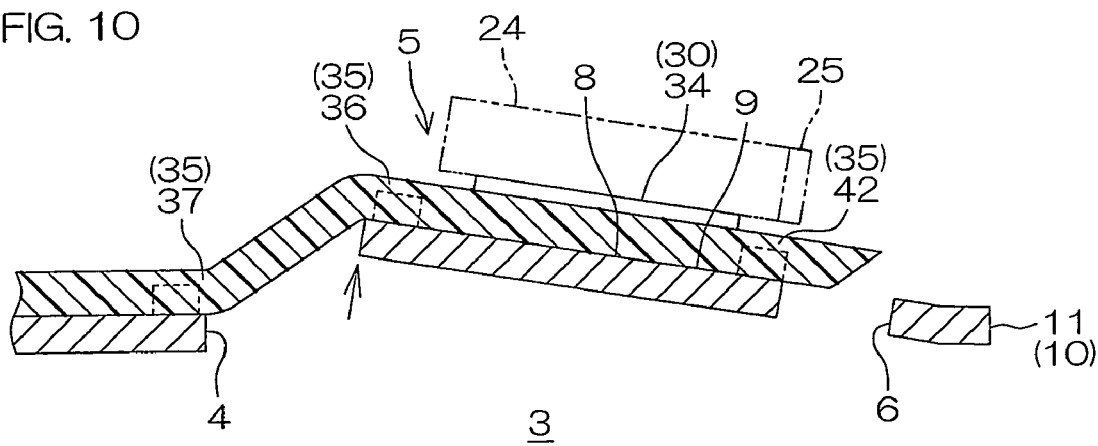
FIG. 10 is a view illustrating a state in which the gimbal of the suspension board with circuit shown in FIG. 1 is bent, which is a cross-sectional view corresponding to FIG. 3.

4 is a cross-sectional view taken along the line B-B of FIG. 2. FIG. 5 is a cross-sectional view taken along the line C-C of FIG. 2. FIGS. 6 and 7 are process views for illustrating a producing method of the suspension board with circuit, of which FIG. 6 is a cross-sectional view corresponding to FIG. 4, and FIG. 7 is a cross-sectional view corresponding to FIG. 5. FIGS. 8 and 9 are views illustrating a method of disposing the optical waveguide, of which FIG. 8 is a plan view corresponding to FIG. 2, and FIG. 9 is a cross-sectional view corresponding to FIG. 3. FIG. 10 is a view illustrating a state in which the gimbal of the suspension board with circuit shown in FIG. 1 is bent, which is a cross-sectional view corresponding to FIG. 3. In FIGS. 1, 2, and 8, an insulating base layer 12 and an insulating cover layer 14 (each described later) are omitted for clear illustration of relative positioning of a conductive pattern 13.

In FIG. 1, the suspension boards with circuit 1 includes a circuit board 10, and an optically assisting portion 17 formed on the circuit board 10.

The circuit board 10 mounts thereon a magnetic head 25 (the imaginary lines of FIGS. 3 and 10) in a hard disk drive, and supports the magnetic head 25, while holding a minute gap between the magnetic head 25 and a hard disk not shown, against an air flow when the magnetic head 25 and the hard disk travel relatively to each other.

The circuit board 10 is formed correspondingly to the outer shape of the suspension board with circuit 1. Specifically, the circuit board 10 is formed in a flat belt shape extending in a longitudinal direction. The circuit board 10 integrally includes a wiring portion 2 disposed on one longitudinal side (hereinafter referred to as a rear side), and a gimbal 3 disposed on the other longitudinal side (hereinafter referred to as a front side) opposite to the wiring portion 2.

The wiring portion 2 is formed in a generally rectangular plan view shape extending in the longitudinal direction.

As shown in FIGS. 1 and 2, the gimbal 3 is formed continuously from the front end of the wiring portion 2 into a generally rectangular plan view shape which protrudes on both widthwise outsides of the wiring portion 2. The gimbal 3 has a slit 4 formed in a generally U-shaped shape which opens toward the front side when viewed in plan views. The two front end portions of the slit 4 are disposed to oppose each other in a widthwise direction. A straight line (imaginary line) connecting the two front end portions of the slit 4 is assumed to be a bend portion 40, described later, along which the gimbal 3 is bent.

The gimbal 3 integrally includes a tongue portion 5 which is widthwise interposed between the two end portions of the slit 4, and an outrigger portion 7 which is disposed on both widthwise outsides of the slit 4.

The tongue portion 5 is defined by the slit 4, and thereby formed in a generally rectangular plan view shape. The tongue portion 5 includes a mounting portion 8, and a terminal formation portion 9.

The mounting portion 8 is a region for mounting thereon a slider 24 (see FIGS. 3 and 5) on which a magnetic head 25 is mounted. The mounting portion 8 is disposed at the rear-side part of the tongue portion 5, and formed in a generally rectangular plan view shape. The mounting portion 8 is disposed to be spaced apart from the rear end edge of the tongue portion 5 to ensure a region where locking portions 27 described later are formed.

The terminal formation portion 9 is a region where magnetic-side connection terminal portions 16B described later are formed. The terminal formation portion 9 is disposed frontward of the mounting portion 8. In the terminal formation portion 9, an emission opening 6 having a generally rectangular plan view shape is formed.

The emission opening 6 is formed in a generally rectangular plan view shape so as to extend through the circuit board 10 in a thickness direction thereof (hereinafter simply referred to as the thickness direction). The emission opening 6 is formed at the widthwise center of the terminal formation portion 9.

On the tongue portion 5, pedestals 30 are provided.

The pedestals 30 are provided in the mounting portion 8 to support the slider 24, and include a first pedestal 31 and a second pedestal 32.

As shown in FIGS. 2 and 5, the first pedestal 31 and the second pedestal are disposed at the longitudinal center of the mounting portion 8 to be widthwise spaced apart from each other at a distance L3 in opposing relation. Specifically, the first pedestal 31 is disposed on one widthwise side of the mounting portion 8, while the second pedestal 32 is disposed on the other widthwise side of the mounting portion 8 to be widthwise spaced apart from the first pedestal 31 at the distance L3 in opposing relation.

The distance L3 between the first pedestal 31 and the second pedestal 32 is set to allow an optical waveguide 20 described later to be disposed. That is, the first pedestal 31 and the second pedestal 32 are arranged widthwise adjacent to and spaced apart from each other at the distance L3 of the same magnitude as that of the width (widthwise length) of the optical waveguide 20.

The first pedestal 31 and the second pedestal 32 are each formed in the same plan view shape, which is a generally rectangular plan view shape extending in the longitudinal direction.

Specifically, the pedestals 30 are formed such that the widthwise inner end surfaces thereof, i.e., one widthwise end surface of the first pedestal 31 and the other widthwise end surface of the second pedestal 32 extend along the both widthwise outer end surfaces of the optical waveguide 20. More specifically, the pedestals 30 are formed such that the widthwise distance between the respective widthwise inner end surfaces thereof is equal to the width of the optical waveguide 20.

The pedestals 30 are formed on the circuit board 10 (a metal supporting board 11 described later). Each of the pedestals 30 includes a pedestal insulating base layer 33, and a pedestal conductive layer 34 formed on the pedestal insulating base layer 33.

The pedestal insulating base layer 33 is formed on the surface of the metal supporting board 11 of the mounting portion 8 correspondingly to the outer shape of the pedestal 30. That is, the pedestal insulating base layer 33 is formed in a generally rectangular plan view shape to ensure the distance L3 which allows the optical waveguide 20 to be disposed between the first pedestal 31 and the second pedestal 32. Consequently, the widthwise inner end surfaces of the pedestal insulating base layers 33 of the first pedestal 31 and the second pedestal 32 are in contact with the widthwise outer end surfaces of the optical waveguide 20.

The pedestal conductive layer 34 is formed on the surface of the pedestal insulating base layer 33 into a shape similar to and slightly smaller than that of the pedestal insulating base layer 33 when viewed in plan view. The slider 24 is supported on the upper surface of the pedestal conductive layer 34.

The dimensions of the pedestal insulating base layer 33 are such that the longitudinal length thereof is in a range of, e.g., 150 to 1500 μm, or preferably 300 to 1000 μm, and the width (widthwise length) thereof is in a range of, e.g., 20 to 400 μm, or preferably 100 to 300 μm.

The widthwise distance L3 between the first pedestal 33 and the second pedestal 32, i.e., the widthwise distance L3 between the pedestal insulating layer 33 of the first pedestal 31 and the pedestal insulating layer 33 of the second pedestal 32 is in a range of, e.g., 5 to 250 μm, or preferably 10 to 150 μm.

The dimensions of the pedestal conductive layer 34 are such that the longitudinal length thereof is in a range of, e.g., 100 to 1400 μm, or preferably 200 to 900 μm, and the width (widthwise length) thereof is in a range of, e.g., 10 to 350 μm, or preferably 80 to 250 μm.

The thickness T1 of each of the pedestals 30 is set to a value of not less than the thickness of the optical waveguide 20.

As a result, the pedestals 30 allow the optical waveguide 20 to be disposed such that the optical waveguide 20 overlaps the slider 24 in the thickness direction. That is, the pedestals 30 are formed to allow the optical waveguide 20 to be disposed in a space widthwise interposed between the first pedestal 31 and the second pedestal 32 under the widthwise center of the slider 24.

As shown in FIGS. 2, 4, and 8, the gimbal 3 is provided with the locking portions 27.

The locking portions 27 are provided to lock the optical waveguide 20, and formed on both longitudinal sides of the slit 4 (an opening portion extending in the widthwise direction) which is longitudinally interposed therebetween.

Specifically, as shown in FIG. 9(a), the locking portions 27 are formed on the circuit board 10 (metal supporting board 11) on both longitudinal sides of the slit 4, and include a first locking portion 28 and a third locking portion 41 each formed frontward of the slit 4, and a second locking portion 29 formed rearward of the slit 4.

As shown in FIG. 2, the first locking portion 28, the third locking portion 41, and the second locking portion 29 are formed generally at the widthwise center of the gimbal 3 to be spaced apart from each other in a front-to-rear direction.

The first locking portion 28 is formed at the end edge of the circuit board 10 which is located frontward of the slit 4, and at the rear end portion of the tongue portion 5. That is, the first locking portion 28 is formed on the rear side part of the mounting portion 8, specifically on the surface of the end edge of the circuit board 10 which is located rearward of the pedestals 30 and frontward of the slit 4. The first locking portion 28 is formed of two projections arranged in widthwise spaced-apart and opposing relation, and each having a generally circular plan view shape. The two projections of the first locking portion 28 are formed such that the respective center lines thereof extend along the both widthwise outer end edges of the optical waveguide 20 described later.

The third locking portion 41 is formed on the front end portion of the tongue portion 5, and disposed frontward of the first locking portion 28 in opposing relation thereto with the pedestals 30 interposed therebetween. That is, the third locking portion 41 is disposed frontward of the pedestals 30, specifically on the front end portion of the mounting portion 8 to oppose the emission opening 6 in the front-to-rear direction. The third locking portion 41 is also formed on the surface of the circuit board 10 of the mounting portion 8. The third locking portion 41 is formed of two projections arranged in widthwise spaced-apart and opposing relation, and each having a generally circular plan view shape. The two projections of the third locking portion 41 are formed such that the respective center lines thereof extend along the both widthwise outer end edges of the optical waveguide 20.

The second locking portion 29 is disposed rearward of the first locking portion 29 in opposing relation thereto with the slit 4 interposed therebetween. That is, the second locking portion 29 is formed at the end edge of the circuit board 10 which is located rearward of the slit 4, specifically on the surface of the end edge of the circuit board 10 which is located rearward of the slit 4. The second locking portion 29 is formed of two projections arranged in widthwise spaced-apart and opposing relation, and each having a generally circular plan view shape. The two projections of the second locking portion 29 are formed such that the respective center lines thereof extend along the both widthwise outer end edges of the optical waveguide 20.

As shown in FIG. 4, the first locking portion 28, the third locking portion 41, and the second locking portion 29 are each formed of a locking conductive layer 26.

The distance L2 (see FIG. 8) between the two locking portions 27 formed at the end edges on both sides of the slit 4 in the front-to-rear direction, i.e., the longitudinal distance (space) L2 between the first locking portion 28 and the second locking portion 28 is in a range of, e.g., 100 to 2000 μm, preferably 200 to 1000 μm, or more preferably 300 to 800 μm.

The longitudinal distance (space) L5 between the first locking portions 28 and the third locking portion 41 formed on both sides of the pedestals 30 in the front-to-rear direction is in a range of, e.g., 200 to 2000 μm, or preferably 350 to 1200 μm.

The dimensions of the first locking portion 28, the third locking portion 41, and the second locking portion 29 are such that the respective diameters thereof are in a range of, e.g., 30 to 200 μm, or preferably 50 to 100 μm. The widthwise space W1 between the two projections of the first locking portion 28 is the same as the widthwise space between the two projections of the third locking portion 41 and as the widthwise space between the two projections of the second locking portion 29, and is in a range of, e.g., not less than 3 μm, preferably not less than 5 μm, or more preferably not less than 80 μm, and normally not more than 180 μm.

As shown in FIGS. 4 and 5, the circuit board 10 includes the metal supporting board 11, the insulating base layer 12 formed on the metal supporting board 11, the conductive pattern 13 formed on the insulating base layer 12, and the insulating cover layer 14 formed on the insulating base layer 12 so as to cover the conductive pattern 13.

As shown in FIG. 1, the metal supporting board 11 is formed to correspond to the outer shape of the circuit board 10.

The insulating base layer 12 is formed to correspond to the positions in the wiring portion 2 and the gimbal 3 where the conductive pattern 13 is formed so as to expose the peripheral end edge of the metal supporting board 11.

As shown in FIG. 1, the conductive pattern 13 integrally and continuously includes external connection terminal portions 16A, the magnetic-side connection terminal portions 16B, and signal wires 15 for connecting the external connection terminal portions 16A and the magnetic-side connection terminal portions 16B.

The plurality of (four) signal wires 15 are provided along the longitudinal direction of the suspension board with circuit 1, and arranged in parallel to be widthwise spaced apart from each other.

The plurality of the signal wires 15 are formed of a first wire 15a, a second wire 15b, a third wire 15c, and a fourth wire 15d. The first wire 15a, the second wire 15b, the third wire 15c, and the fourth wire 15d are arranged in this order from one widthwise side toward the other widthwise side.

More specifically, the first wire 15a, the second wire 15b, the third wire 15c, and the fourth wire 15d are formed to extend in parallel with each other in the wiring portion 2. In the gimbal 3, the first wire 15a and the second wire 15b (a first pair 15e of wires) are disposed to extend along the outrigger portion 7 on one widthwise side, while the third wire 15c and the fourth wire 15e (a second pair 15f of wires) are disposed to extend along the outrigger portion 7 on the other widthwise side. The first wire 15a, the second wire 15b, the third wire 15c, and the fourth wire 15d (the first pair 15e of wires and the second pair 15f of wires) are disposed to extend in the longitudinal direction, reach the front end portion of the outrigger portion 7, extend inwardly in the widthwise direction, further fold back toward the rear side, and reach the terminal formation portion 9.

The plurality of (four) external connection terminal portions 16A are provided to be disposed rearward of the wiring portion 2, and connected to the respective rear end portions of the signal wires 15. The external connection terminal portions 16A are arranged in widthwise spaced-apart relation. The external connection terminal portions 16A are connected to terminal portions, not shown, of an external circuit board (such as, e.g., a read/write board) not shown.

The magnetic-side connection terminal portions 16B are disposed in the gimbal 3. More specifically, the magnetic-side connection terminal portions 16B are disposed at the terminal formation portion 9 of the tongue portion 5. The plurality of (four) magnetic-side connection terminal portions 16B are provided to be connected to the respective front end portions of the signal wires 15.

The magnetic-side connection terminal portions 16B are arranged in widthwise spaced-apart relation. The magnetic-side connection terminal portions 16B are connected to terminal portions, not shown, of the magnetic head 25.

The insulating cover layer 14 is disposed over the wiring portion 2 and the gimbal 3. As shown in FIGS. 4 and 5, the insulating cover layer 14 is disposed on the insulating base layer 12 so as to correspond to the positions where the signal wires 15 are formed. The insulating cover layer 14 is formed so as to expose the external connection terminal portions 16A and the magnetic-side connection terminal portions 16B, and cover the signal wires 15.

As shown in FIG. 1, the optically assisting portion 17 is provided for the suspension board with circuit 1 to be used for an optically assisted method, and includes the optical waveguide 20 and a light emitting element 18.

The optical waveguide 20 is disposed over the wiring portion 2 and the gimbal 3 to be spaced apart from the signal wires 15. Specifically, the optical waveguide 20 is disposed in a generally linear plan view shape along the longitudinal direction so as to extend between the first pair 15e of wires and the second pair 15f of wires, i.e., between (at a middle position between) the second wire 15b and the third wire 15c in parallel therewith.

The optical waveguide 20 is also disposed to perpendicularly traverse the slit 4 from the front end portion of the wiring portion 2, and pass between the first pedestal 31 and the second pedestal 32 such that a front end surface 19 thereof faces the emission opening 6. As a result, the optical waveguide 20 is disposed such that the longitudinal middle portion thereof passes under the slider 24 (FIG. 5).

As shown in FIGS. 2, 8, and 9, the longitudinally middle portion of the optical waveguide 20 is provided with locked portions 35 to be locked by the respective locking portions 27.

The locked portions 35 are formed of a first locked portion 36, a third locked portion 42, and a second locked portion 37 so as to correspond to the first locking portion 28, the third locking portion 41, and the second locking portion 29, respectively.

The first locked portion 36, the third locked portion 42, and the second locked portion 37 are formed so as to be locked by the two projections of the first locking portion 28, the two projections of the third locking portion 41, and the two projections of the second locking portion 29, respectively.

That is, the first locked portion 36 is formed as two depressions each having a generally semicircular plan view shape, and depressed widthwise inwardly from the both widthwise outer end surfaces of the optical waveguide 20 so as to correspond to the two projections of the first locking portion 28. The two depressions of the first locked portion 36 are disposed in widthwise opposing relation.

The third locked portion 42 is formed as two depressions each having a generally semicircular plan view shape, and depressed widthwise inwardly from the both widthwise outer end surfaces of the optical waveguide 20 so as to correspond to the two projections of the third locking portion 41. The two depressions of the third locked portion 42 are disposed in widthwise opposing relation.

The second locked portion 37 is formed as two depressions each having a generally semicircular plan view shape, and depressed widthwise inwardly from the both widthwise outer end surfaces of the optical waveguide 20 so as to correspond to the two projections of the second locking portion 29. The two depressions of the second locked portion 37 are disposed in widthwise opposing relation.

The linear distance L1 between the two locked portions 35 corresponding to the two locking portions 27 (the first locking portion 28 and the second locking portion 29) at the end edge of the suspension board 10 which are located on both sides of the slit 4 in the front-to-rear direction is set longer than the linear distance L2 between the two locking portions 27 (the first locking portion 28 and the second locking portion 29). Specifically, the longitudinal distance L1 between the first locked portion 36 and the second locked portion 37 is set longer than the longitudinal distance L2 between the first locking portion 28 and the second locking portion 29.

When the distance (linear distance along the front-to-rear direction) L2 between the first locking portion 28 and the second locking portion 29 is assumed to be 100%, the longitudinal distance (linear distance along the front-to-rear direction) L1 between the first locked portion 36 and the second locked portion 37 based on the distance L2 is in a range of, e.g., not less than 101%, preferably not less than 105%, or more preferably not less than 110%, and normally not more than 200%. Specifically, the longitudinal distance L1 between the first locked portion 36 and the second locked portion 37 is in a range of, e.g., not less than 1 μm, preferably not less than 5 μm, or more preferably not less than 10 μm, and normally not more than 3000 μm.

When the distance L1 between the first locked portion 36 and the second locked portion 37 is under the range shown above, the degree of slackness of the optical waveguide, which is described later, is excessively low. As a result, the optical waveguide 20 may not be able to sufficiently stretch even with the tension resulting from the bend of the gimbal 3, and it may be impossible to prevent damage to the optical waveguide 20 and a broken wire. When the distance L1 between the first locked portion 36 and the second locked portion 37 is over the range shown above, the optical waveguide 20 may be bent at an excessively acute angle between the first locked portion 36 and the second locked portion 37, and it may be impossible to reduce a loss in optical signal.

The longitudinal distance L4 between the first locked portion 36 and the third locked portion 42 is the same as the longitudinal length L5 between the first locking portion 28 and the third locking portion 41 which correspond thereto.

Since the distance L1 between the first locked portion 36 and the second locked portion 37 is longer than the distance L2 between the first locking portion 28 and the second locking portion 29, the optical waveguide 20 is slack in the slit 4, as shown in FIGS. 3 and 9(c).

Specifically, when the first locked portion 36 and the second locked portion 37 are locked by the first locking portion 28 and the second locking portion 29 which are at the longitudinal distance from each other shorter than the longitudinal distance between the first locked portion 36 and the second locked portion 37, the optical waveguide 20 between the first locked portion 36 and the second locked portion 37 is restricted from stretching bath frontwardly and rearwardly of the first locked portion 36 and the second locked portion 37 by the locking by the locking first locking portion 28 and the second locking portion 29.

More specifically, when the first locked portion 36 and the second locked portion 37 are locked by the first locking portion 28 and the second locking portion 29, the optical waveguide 20 between the first locked portion 36 and the second locked portion 37 is restricted from stretching frontwardly of the first locked portion 36 by the first locking portion 28, and stretching rearwardly of the second locked portion 37 by the second locking portion 29.

As a result, a slack is formed in the optical waveguide 20 between the first locked portion 36 and the second locked portion 37.

The optical waveguide 20 between the first locked portion 36 and the second locked portion 37 is slack upwardly in the thickness direction into a curved shape with no edge formed therein.

Since the distance L4 between the first locked portion 36 and the third locked portion 42 is the same as the distance L5 between the first locking portion 28 and the third locking portion 41, the optical waveguide 20 between the first locked portion 36 and the third locked portion 42 which are locked by the first locking portion 28 and the third locked portion 41 is formed linearly without being slackened.

As shown in FIG. 1, the optical waveguide 20 is optically connected to the light emitting element 18. That is, the optical waveguide 20 is formed such that the rear end thereof is connected to the light emitting element 18, and the front end thereof faces the emission opening 6.

The light emitting element 18 is a light source for causing light to be incident on the optical waveguide 20. For example, the light emitting element 18 is a light source which converts electrical energy to optical energy, and emits high energy light. The light emitting element 18 is disposed on the rear end side of the circuit board 10. More specifically, the light emitting element 18 is disposed on the rear end side of the wiring portion 2 to be located between and spaced apart from the second wire 15b and the third wire 15c.

As shown in FIG. 3, the optical waveguide 20 is formed such that the front end surface (end surface of the front end portion) 19 thereof crosses, e.g., the front-to-rear direction at a predetermined angle (inclination angle) α. As a result, the optical waveguide 20 is formed such that the front end surface 19 thereof serves as a reflection surface having the inclination angle α. Therefore, the light incident on the optical waveguide 20 has an optical path thereof reoriented at a predetermined angle by the front end surface 19, and then applied toward a desired position on the hard disk not shown, while being scattered. The inclination angle α is not particularly limited, and is in a range of, e.g., 35° to 55°, preferably 40° to 50°, or specifically 45°.

In the optically assisting portion 17, electrical energy supplied from the external circuit board not shown is converted to optical energy in the light emitting element 18, and the resulting light is emitted to the optical waveguide 20. The emitted light passes through the optical waveguide 20 to be reflected at the front end surface 19, and applied to the hard disk not shown.

As shown in FIGS. 4 and 5, the optical waveguide 20 includes an underclad layer 21, a core layer 22 formed on the underclad layer 21, and an overclad layer 23 formed on the underclad layer 21 so as to cover the core layer 22.

The overclad layer 23 is formed such that the both widthwise outer end edges thereof are at the same positions as those of the both widthwise outer end edges of the underclad layer 21 when viewed in plan view.

As shown in FIGS. 2 and 8, in the optical waveguide 20, the locked portions 35 are each formed of the underclad layer 21 and the overclad layer 23. That is, the core layer 22 is disposed to be widthwise spaced apart from the both widthwise outer end surfaces of the locked portions 35.

Next, a producing method of the suspension board with circuit 1 is described with reference to FIGS. 6 to 9.

In the method, as shown in FIGS. 6(a) to 6(e) and 7(a) to 7(d), the circuit board 10 is prepared first.

To prepare the circuit board 10, the metal supporting board 11 is prepared first, as shown in FIGS. 6(a) and 7(a). Examples of a metal material used to form the metal supporting board 11 include stainless steel and a 42-alloy. Preferably, stainless steel is used. The thickness of the metal supporting board 11 is in a range of, e.g., 10 to 30 μm, or preferably 15 to 25 μm.

Next, as shown in FIGS. 6(b) and 7(b), the insulating base layer 12 and the pedestal insulating base layer 33 are simultaneously formed.

Examples of an insulating material used to form the insulating base layer 12 and the pedestal insulating base layer 33 include synthetic resins such as polyimide, polyether nitrile, polyether sulfone, polyethylene terephthalate, polyethylene naphthalate, and polyvinyl chloride. Preferably, a photosensitive synthetic resin is used, or more preferably, photosensitive polyimide is used.

To form the insulating base layer 12 and the pedestal insulating base layer 33, e.g., a photosensitive synthetic resin is coated on the surface of the metal supporting board 11, dried, exposed to light in a pattern in which the insulating base layer 12 and the pedestal insulating base layer 33 are formed, developed, and then cured as necessary.

The insulating base layer 12 and the pedestal insulating base layer 33 can also be formed in the foregoing pattern by, e.g., uniformly coating a solution of any of the synthetic resins mentioned above on the surface of the metal supporting board 11, drying the solution, curing it by heating as necessary, and then etching it.

Otherwise, the insulating base layer 12 and the pedestal insulating base layer 33 can also be formed by, e.g., preliminarily forming the synthetic resin into a film in the foregoing pattern, and sticking the film onto the surface of the metal supporting board 11 via a known adhesive layer.

The thicknesses of the insulating base layer 12 and the pedestal insulating base layer 33 thus formed are in a range of, e.g., 1 to 20 μm, or preferably 8 to 15 μm.

Next, as shown in FIGS. 6(c) and 7(c), the conductive pattern 13, the pedestal conductive layer 34, and the locking conductive layer 26 are simultaneously formed.

Examples of a conductive material used to form the conductive pattern 13, the pedestal conductive layer 34, and the locking conductive layer 26 include copper, nickel, gold, tin, a solder, and an alloy thereof. Preferably, copper is used.

To form the conductive pattern 13, the pedestal conductive layer 34, and the locking conductive layer 26, a known patterning method such as, e.g., an additive method or a subtractive method is used. Preferably, the additive method is used.

Specifically, in the additive method, a conductive seed film is formed first on the surface of the metal supporting board 11 including the insulating base layer 12 and the pedestal insulating base layer 33 by a sputtering method or the like. Then, a plating resist is formed in a pattern reverse to that of the conductive pattern 13, the pedestal conductive layer 34, and the locking conductive layer 26 on the surface of the conductive seed film. Thereafter, on the surface of the conductive seed film on each of the insulating base layer 12 and the pedestal insulating base layer 33 which is exposed from the plating resist, the conductive pattern 13, the pedestal conductive layer 34, and the locking conductive layer 26 are formed by electrolytic plating. Thereafter, the plating resist and the portion of the conductive seed film where the plating resist is laminated are removed.

The thicknesses of the conductive pattern 13, the pedestal conductive layer 34, and the locking conductive layer 26 thus formed are in a range of, e.g., 3 to 50 µm, or preferably 5 to 25 µm.

As a result, the thickness T1 of the pedestal 30 is set to a value equal to or not less than the thickness of the optical waveguide 20 such that the optical waveguide 20 overlaps the slider 24 in the thickness direction and the optical waveguide 20 is allowed to be disposed. Specifically, the total thickness T1 of the thickness of the pedestal insulating base layer 33 and the thickness of the pedestal conductive layer 34 is in a range of, e.g., not less than 4 µm, preferably not less than 13 µm, or more preferably not less than 18 µm, and normally not more than 60 µm. When the thickness T1 of the pedestal 30 is less than the range shown above, it may be impossible to allow the optical waveguide 20 to be disposed.

In this manner, as shown in FIG. 6(c), the locking portions 27 formed of the locking conductive layer 26 can be formed.

Next, as shown in FIGS. 6(d) and 7(d), the insulating cover layer 14 is formed in the foregoing pattern on the insulating base layer 12. As an insulating material for forming the insulating cover layer 14, the same insulating material as that of the insulating base layer 12 can be listed.

To form the insulating cover layer 14, e.g., a photosensitive synthetic resin is coated on the surface of the insulating base layer 12 including the conductive pattern 13, dried, exposed to light and developed in the foregoing pattern, and then cured as necessary.

The insulating cover layer 14 can also be formed in the foregoing pattern by, e.g., uniformly coating a solution of the synthetic resin mentioned above on the surface of the insulating base layer 12 including the conductive pattern 13, drying the solution, curing it by heating as necessary, and then etching it.

Otherwise, the insulating cover layer 14 can also be formed by, e.g., preliminarily forming the synthetic resin into a film in the foregoing pattern, and sticking the film onto the surface of the insulating base layer 12 including the conductive pattern 13 via a known adhesive layer.

The thickness of the insulating cover layer 14 thus formed is in a range of, e.g., 2 to 25 µm, or preferably 3 to 10 µm.

Thereafter, as indicated by the imaginary lines in FIG. 7(d), a metal plating layer 38 is formed as necessary on the surface of each of the magnetic-side connection terminal portions 16B, the external connection terminal portions 16A, and the pedestal conductive layer 34. The metal plating layer 38 is formed of gold or nickel by electrolytic plating or electroless plating. The thickness of the metal plating layer 38 is in a range of, e.g., 0.5 to 5 µm, or preferably 0.5 to 3 µm.

Next, as shown in FIGS. 2, 3, and 7(e), the slit 4 and the emission opening 6 are formed in the metal supporting board 11, while the metal supporting board 11 is trimmed, whereby the circuit board 10 is obtained. Thus, the wiring portion 2 and the gimbal 3 having the tongue portion 5 (including the mounting portion 8 and the terminal formation portion 9) and the outrigger portion 7 are simultaneously formed.

To form the slit 4 and the emission opening 6, e.g., discharging, laser processing, mechanical punching, etching, or the like is used. Preferably, etching (wet etching) is used. For wet etching, an aqueous acidic solution such as, e.g., an aqueous ferric solution is used.

In this manner, the slit 4 is formed, and the circuit board 10 including the wiring portion 2 and the gimbal 3 having the tongue portion 5 and the outrigger portion 7 can be prepared.

Additionally, as indicated by the imaginary lines in FIGS. 6(e) and 7(f), the optical waveguide 20 is prepared.

To prepare the optical waveguide 20, the underclad layer 21, the core layer 22, and the overclad layer 23 are successively laminated on a released sheet such as a polyethylene terephthalate (PET) sheet not shown. Thereafter, the optical waveguide 20 is stripped from the released sheet.

To successively laminate the underclad layer 21, the core layer 22, and the overclad layer 23, the under clad layer 21 is formed first on the released sheet.

Examples of a material used to form the underclad layer 21 include a polyimide resin, a polyamide resin, a silicone resin, an epoxy resin (such as, e.g., an alicyclic epoxy resin), an acrylic resin, a fluorene derivative resin, a resin mixture of a fluorene derivative resin and an alicyclic epoxy resin, and a resin mixture of any of the resins listed above and an alicyclic ether compound (such as, e.g., an oxetane compound). Preferably, the resins listed above are each mixed with a photosensitizer to be used as a photosensitive resin. Preferably, a resin mixture of a photosensitive fluorene derivative resin (produced from a photosensitive fluorene epoxy resin as a raw material) and an alicyclic epoxy resin is used. As the photosensitizer, a known onium salt or the like is used, for example, or more specifically, 4,4-bis[di(β-hydroxyethoxy)phenylsulfinio]phenylsulfide-bis-hexafluoroantimonate or the like is used.

To form the underclad layer 21 in a pattern in which the locked portions 35 are formed, e.g., a varnish (resin solution) of any of the resins mentioned above is prepared using a known diluent, coated on the surface of the released sheet, dried, and then cured as necessary. In the case where a photosensitive resin is used, a vanish is coated, dried, exposed to light via a photomask, developed by dissolving an unexposed portion in a known organic solvent or the like, and then cured as necessary.

The refractivity of the underclad layer 21 thus formed is in a range of, e.g., 1.45 to 1.55. The thickness of the underclad layer 21 is in a range of, e.g., 1 to 50 µm, or preferably 5 to 10 µm. The width of the underclad layer 21 is in a range of, e.g., 5 to 200 µm, or preferably 10 to 100 µm.

Then, the core layer 22 is formed on the underclad layer 21.

As a material for forming the core layer 22, a resin material having a refractivity higher than that of the resin material of the underclad layer 21 is used. Examples of such a resin material include the same resins as mentioned above. Preferably, a resin mixture of a photosensitive fluorene derivative resin (produced from a photosensitive fluorene epoxy resin as a raw material) and an oxetane compound is used.

To form the core layer 22 in the foregoing pattern, e.g., a varnish (resin solution) of the resin mentioned above is prepared using a known diluent, and the varnish is coated on the surface of the released sheet including the underclad layer 21, dried, and then cured as necessary. In the case where a photosensitive resin is used, a varnish is coated, dried, exposed to light via a photomask, developed by dissolving an unexposed portion in a known organic solvent or the like, and then cured as necessary.

The refractivity of the core layer 22 thus formed is set higher than that of the underclad layer 21, and is in a range of, e.g., 1.55 to 1.65. The thickness of the core layer 22 is in a range of, e.g., 1 to 30 μm, or preferably 2 to 10 μm. The width of the core layer 22 is in a range of, e.g., 1 to 30 μm, or preferably 2 to 20 μm.

Then, the overclad layer 23 is formed on the underclad layer 21 so as to cover the core layer 22.

As a material for forming the overclad layer 23, the same resin material as used to form the underclad layer 21 mentioned above is used.

To form the overclad layer 23 in the pattern in which the locked portions 35 are formed, e.g., a varnish (resin solution) of the resin mentioned above is prepared using a known diluent, and the varnish is coated on the surface of the released sheet including the core layer 22 and the underclad layer 21, dried, and then cured as necessary. In the case where a photosensitive resin is used, a varnish is coated, dried, exposed to light via a photomask, developed by dissolving an unexposed portion in a known organic solvent or the like, and then cured as necessary.

The refractivity of the overclad layer 23 thus formed is set lower than that of the core layer 22. For example, the refractivity of the overclad layer 23 is set to the same range as that of the refractivity of the underclad layer 21. The thickness of the overclad layer 23 measured from the surface of the core layer 22 is in a range of, e.g., 1 to 50 μm, or preferably 5 to 10 μm. The width of the overclad layer 23 is in a range of, e.g., 5 to 200 μm, or preferably 10 to 100 μm.

By thus successively laminating the underclad layer 21, the core layer 22, and the overclad layer 23 on the released sheet, the optical waveguide 20 including the laminated layers can be prepared.

The thickness of the optical waveguide 20 is in a range of, e.g., 3 to 50 μm, or preferably 12 to 18 μm.

It is also possible to form each of the underclad layer 21 and the overclad layer 23 into a plan view shape generally unformed with the locked portions 35, and then form the locked portions 35 by, e.g., laser processing, mechanical punching, or the like.

As shown in FIGS. 8 and 9(a), the optical waveguide 20 is formed such that the linear distance L2 between the first locking portion 28 and the second locking portion 29 is shorter than the linear length L1 of the optical waveguide 20 between the first locked portion 36 and the second locked portion 37.

Next, as shown in FIGS. 9(b) and 9(c), the optical waveguide 20 is disposed on the circuit board 10 so as to traverse the slit 4.

To dispose the optical waveguide 20, the locked portions 35 are locked by the locking portions 27, while the optical waveguide 20 between the first locked portion 36 and the second locked portion 37 is slackened.

Specifically, as indicated by the arrows in FIG. 9(a), the first locked portion 36 and the second locked portion 37 are brought closer to each other in the front-to-rear direction. More specifically, the first locked portion 36 is moved toward the rear side, while the second locked portion 37 is moved toward the front side.

Then, as shown in FIG. 9(b), with the movement of the first locked portion 36 and the second locked portion 37 of the optical waveguide 20, the optical waveguide 20 between the first locked portion 36 and the second locked portion 37 can be slackened.

Thereafter, as shown in FIG. 9(c), the optical waveguide 20 is disposed on the upper surface of the circuit board 10.

Specifically, the locked portions 35 of the optical waveguide 20 are locked by the locking portions 27 corresponding thereto. That is, of the optical waveguide 20, the first locked portion 36 is locked by the first locking portion 28, the third locked portion 42 is locked by the third locking portion 41, and the second locked portion 37 is locked by the second locking portion 29.

Additionally, while the optical waveguide 20 is locked by the locking portions 27, the optical waveguide 20 is fitted into the space between the pedestals 30, i.e., into the space between the first pedestal 31 and the second pedestal 32.

By thus causing the optical waveguide 20 to be locked by the locking portions 27, while fitting the optical waveguide 20 into the space between the pedestals 30, the positioning of the optical waveguide 20 is accomplished. That is, the front end of the optical waveguide 20 is positioned with respect to the emission opening 6. In other words, the locked portions 35 and the pedestals 30 serve also as positioning portions for the positioning of the optical waveguide 20.

When the optical waveguide 20 is disposed, it is disposed on the upper surface of the circuit board 10 via an adhesive layer as necessary. The adhesive layer is laminated on the lower surface of the optical waveguide 20 except for the portion thereof located between the first locked portion 36 and the second locked portion 37, i.e., on the lower surface of the portion (including the third locked portion 42) of the optical waveguide 20 which is located frontward of the first locked portion 36 and on the portion of the optical waveguide 20 which is located rearward of the second locked portion 37. Then, the adhesive layer is laminated on the upper surface of the circuit board 10.

Next, as shown in FIG. 1, at the rear-side part of the wiring portion 2, the light emitting element 18 is placed on the circuit board 10 so as to be optically connected to the rear end of the optical waveguide 20.

In this manner, the suspension board with circuit 1 is obtained.

Next, a description is given to the outline of a process since the slider 24 with the magnetic head 25 mounted thereon is mounted on the suspension board with circuit 1 thus obtained till the suspension board with circuit 1 is mounted in the hard disk drive.

First, as shown in FIG. 10, the gimbal 3 of the obtained suspension board with circuit 1 is bent. Specifically, the gimbal 3 is bent along the bend portion 40 indicated by the imaginary line in FIG. 2. That is, the gimbal 3 is bent such that the metal supporting board 11 is on the mountain side of the bent portion 40.

The slider 24 with the magnetic head 25 mounted thereon is mounted on the mounting portion 8 after or before the bending mentioned above. By the mounting of the slider 24, terminal portions, not shown, of the magnetic head 25 are electrically connected to the magnetic-side connection terminal portions 16B.

In the mounting of the slider 24, the magnetic-side terminal portions 16B and the terminal portions of the magnetic head 25 are electrically connected. At the same time as the magnetic-side connection terminal portions 16B are connected, the external connection terminal portions 16A (see FIG. 1) and the terminal portions (not shown) of the read/write board are electrically connected.

Next, the suspension board with circuit 1 is mounted in the hard disk drive. In the mounting of the suspension board with circuit 1 in the hard disk drive, the magnetic head 25 is disposed to oppose the hard disk not shown which rotates relatively to the magnetic head 25, while holding a minute gap between itself and the hard disk. As a result, the magnetic head 25 is maintained at a predetermined angle with respect to the hard disk not shown.

As a result, an optically assisted method is used in the hard disk drive in which the magnetic head 25, the slider 24, the suspension board with circuit 1, and the external circuit board not shown are mounted.

In the suspension board with circuit 1, the slider 24 with the magnetic head 25 mounted thereon is mounted on the mounting portion 8, and the mounting portion 8 is bent to maintain the magnetic head 25 at a predetermined angle with respect to the hard disk not shown.

At this time, by the bending of the mounting portion 8, the both longitudinal end edges of the circuit board 10 between which the slider 24 is interposed are drawn away from each other in the thickness direction. As a result, tension in the thickness direction is loaded on the optical waveguide 20 in the slit 4.

However, since the optical waveguide 20 in the slit 4 is slack, the loaded tension allows the optical waveguide 20 in the slit 4 to stretch in the thickness direction.

As a result, it is possible to prevent damage to the optical waveguide 20 or a broken wire in the slit 4 to provide excellent connection reliability, and smoothly bend the mounting portion 8 to smoothly implement an optically assisted method.

Since the optical waveguide 20 is disposed so as to traverse the slit 4, the optical waveguide 20 can be disposed in a generally linear simplified shape by eliminating the need to route the optical waveguide 20, and a loss in optical signal can be reduced. As a result, it is possible to reduce the loss in optical signal, while reducing production cost.

In addition, when the distance L2 between the first locking portion 28 and the second locking portion 29 is set shorter than the distance L1 between the first locked portion 36 and the second locked portion 37, and the first locked portion 36 and the second locked portion 37 are locked by the first locking portion 28 and the second locking portion 29, it is possible to easily slacken the optical waveguide 20 between the first locked portion 36 and the second locked portion 37. This allows the optical waveguide 20 to be easily and reliably slackened.

Further, in the suspension board with circuit 1, the pedestals 30 which support the slider 24 allow the optical waveguide 20 to be disposed to overlap the slider 24 in the thickness direction.

Specifically, the optical waveguide 20 is disposed to pass between the first pedestal 31 and the second pedestal 32 along the front-to-rear direction. As a result, the optical waveguide 20 is disposed to pass through the slider 24 along the front-to-rear direction when projected in the thickness direction.

As a result, even when the optical waveguide 20 is not routed to pass around the slider 24, the optical waveguide 20 can be disposed in a generally linear simplified shape so as to overlap the slider 24.

Therefore, it is possible to reduce a loss in optical signal in the optical waveguide 20.

Additionally, in the suspension board with circuit 1, positioning using the pedestals 30 allows easy positioning of the optical waveguide 20.

Further, as long as the pedestals 30 are formed accurately in advance, the optical waveguide 20 can be accurately disposed.

In the description of the producing method of the suspension board with circuit 1 given above, the optical waveguide 20 is disposed after the slit 4 and the emission opening 6 are formed. However, the optical waveguide 20 can also be disposed, e.g., before the slit 4 and the emission opening 6 are formed. In that case, in the wet etching for forming the slit 4 and the emission opening 6, an aqueous acescent solution is used as an etchant in terms of protecting the optical waveguide 20.

Preferably, the optical waveguide 20 is disposed after the slit 4 and the emission opening 6 are formed. This order of process steps can allow reliable protection of the optical waveguide 20 from erosion by the etchant.

In the description given above, the locking portions 27 are each formed only of the locking conductive layer 26. However, the locking portions 27 can also be each formed of, e.g., at least one layer (with the exception of one layer made of the locking conductive layer 26) selected from the group consisting of the locking insulating base layer, the locking conductive layer 26, and the locking insulating cover layer, though not shown.

Figure 11:
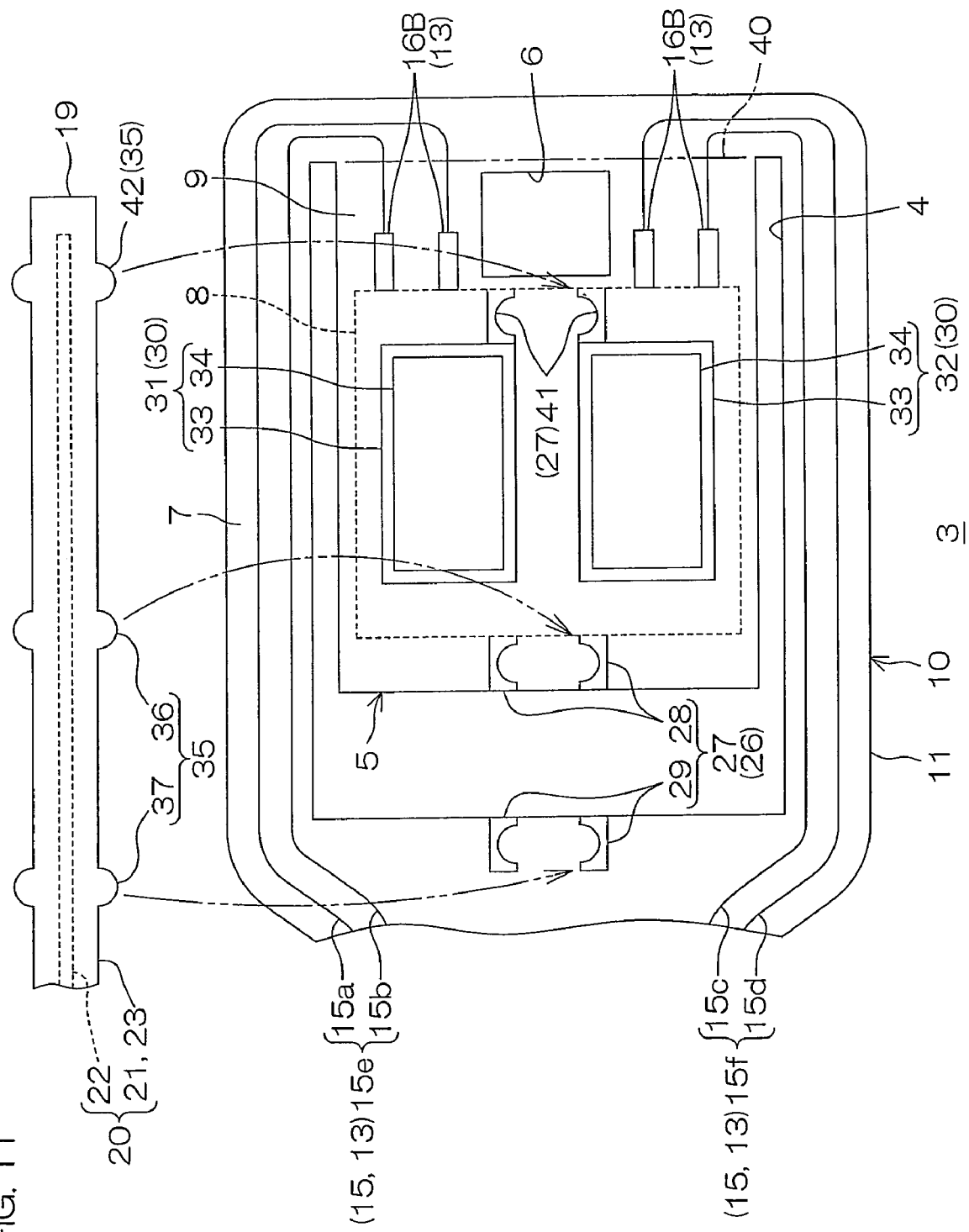
FIG. 11 is an enlarged plan view of the gimbal of the suspension board with circuit according to another embodiment (in which the locked portions are formed as protrusions, and locking portions are formed as depressions) of the present invention.

In the description given above, the first locking portion 28, the second locking portion 29, and the third locking portion 41 are each formed of the two projections (points), while the first locked portion 36, the second locked portion 37, and the third locked portion 42 are each formed as the depressions. However, the shapes of the locking portions 27 and the locked portions 35 are not limited to those shown above. For example, as shown in FIG. 11, the first locked portion 36, the second locked portion 37, and the third locked portion 42 can be each formed as two protrusions which protrude widthwise outwardly from the both widthwise outer ends of the optical waveguide 20 into a generally semicircular plan view shape. At the same time, the first locking portion 28, the second locking portion 29, and the third locking portion 41 can also be each formed as depressions which are disposed to oppose each other in the widthwise direction, and depressed widthwise outwardly from the widthwise inner end surfaces.

In the description given above, the locking portions 27 are each formed in a generally circular plan view shape. However, the shape of the locking portion 27 is not particularly limited. For example, the locking portion 27 can also be formed into an appropriate shape such as a generally polygonal plan view shape. The locked portions 35 are each formed into a shape which corresponds to the shape of the locking portion 27 shown above.

In the description given above, the second locking portion 29 is formed at the end edge located rearward of the slit 4. However, the second locking portion 29 can also be formed to be rearwardly spaced apart from the end edge located rearward of the slit 4. That is, the second locking portion 29 can also be formed in the wiring portion 2 (at a middle portion thereof in the front-to-rear direction).

In the description given above, the two locking portions, i.e., the first locking portion 28 and the third locking portion 41 are formed frontward of the slit 4. However, it is also possible to form, e.g., one locking portion, i.e., at least either one of the first locking portion 28 and the third locking portion 41.

Preferably, at least the first locking portion 28 is formed, or more preferably, both of the first locking portion 28 and the third locking portion 41 are formed.

When at least the first locking portion 28 is formed, a slack can be reliably formed in the optical waveguide 20 in the slit 4. When both of the first locking portion 28 and the third locking portion 41 are formed, the optical waveguide 20 can be locked more reliably and disposed more accurately than when only the first locking portion 28 or the third locking portion 41 is formed.

In the description given above, the first locking portion 28 and the third locking portion 41 are formed frontward of the slit 4, and the optical waveguide 20 is locked using the first locking portion 28 and the third locking portion 41. However, the optical waveguide 20 can also be locked using the pedestals 30 instead of using the first locking portion 28 and the third locking portion 41, though not shown. In that case, a fourth locking portion is formed as a depression corresponding to the plan view shape of the pedestal 30 in the under clad layer 21 and the overclad layer 23 of the optical waveguide 20, though not shown.

Alternatively, it is also possible to form a fourth locked portion in the underclad layer 21 and the overclad layer 23 in addition to the first locked portion 36 and the third locked portion 42. As a result, on the side frontward of the slit 4, the fourth locked portion, the first locked portion 36, and the third locked portion 41 of the optical waveguide 20 can be locked using the pedestals 30, the first locking portion 28, and the third locking portion 41. This allows the optical waveguide 20 to be disposed more accurately.

Figure 12:
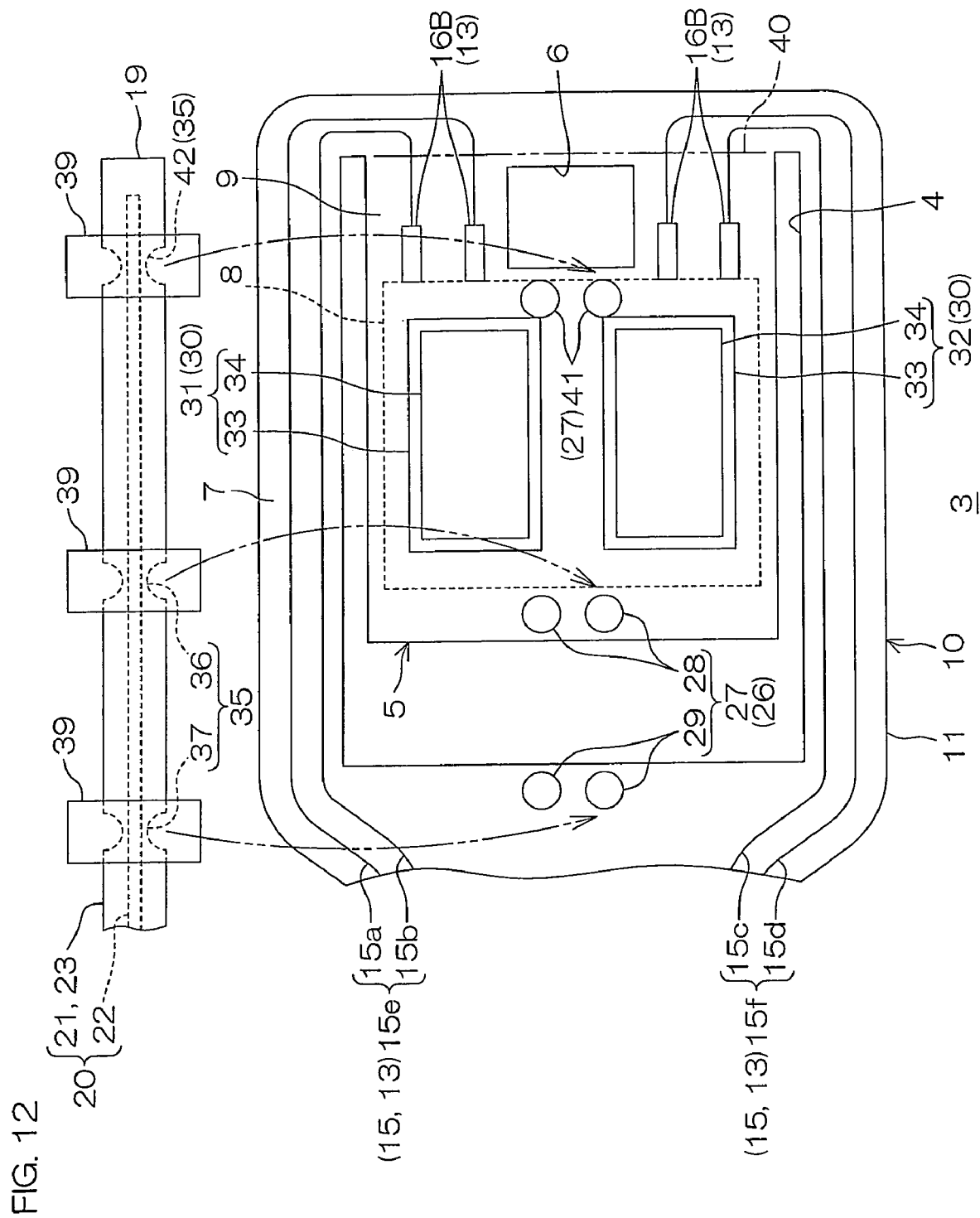
FIG. 12 is a view illustrating the method of disposing the optical waveguide in the suspension board with circuit according to still another embodiment (in which a reinforcing plate is provided at each of the locked portions) of the present invention, which is a plan view corresponding to FIG. 9.

In the description given above, the locked portions 35 of the optical waveguide 20 are caused to be locked by the locking portions 27 without reinforcing the locked portions 35. However, as shown in FIGS. 12 and 13, it is also possible to, e.g., provide a reinforcing plate 39 made of a metal on the surface (the upper surface of the overclad layer 23) of each of the locked portions 35 to reinforce the locked portion 35, and the reinforced locked portion 35 is locked by the locking portion 27.

As the metal for forming the reinforcing plate 39, the same metal material as used to form the metal supporting board 11 is used. The reinforcing plate 39 is formed in a generally rectangular shape including the first locked portion 36, the third locked portion 42, and the second locked portion 37, and extending in the widthwise direction when viewed in plan view. The shape of the reinforcing plate 39 is not limited to the shape mentioned above. The reinforcing plate 39 can also be formed into an appropriate shape.

Figure 13:
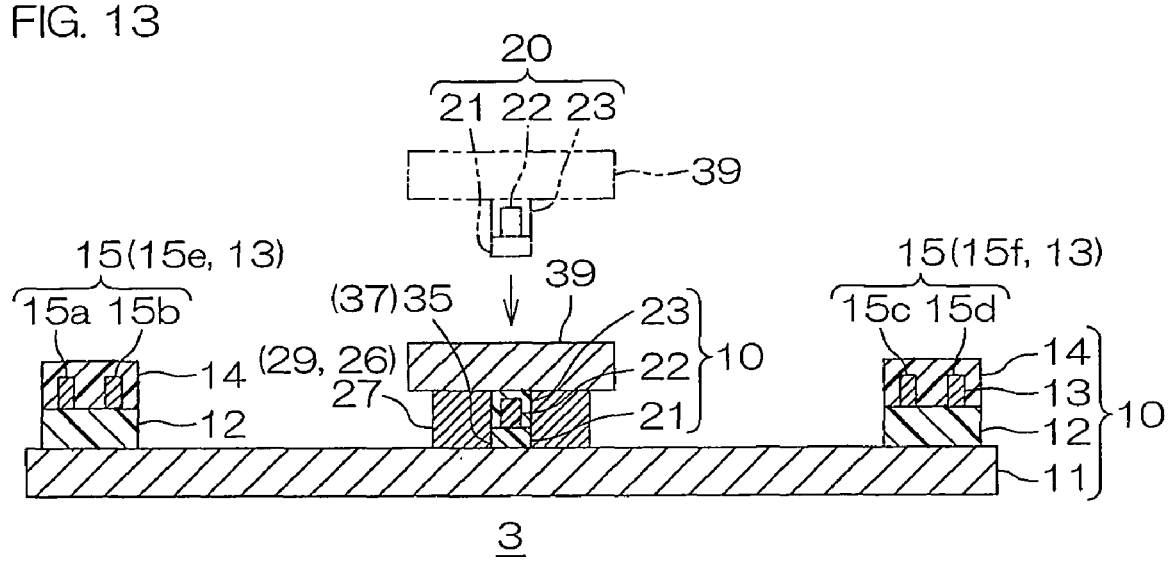
FIG. 13 shows the suspension board with circuit according to the still another embodiment (in which the reinforcing plate is provided at each of the locked portions) of the present invention, and is a cross-sectional view corresponding to FIG. 5.

As shown in FIG. 13, the thickness of the optical waveguide 20 is the same as that of each of the pedestals 30 (the pedestal insulating base layer 33).

When the reinforcing plate 39 is provided, it is possible to cause the locked portions 35 to be more reliably locked by the locking portions 27, and more reliably form a slack.

In the description of FIGS. 2 and 4 given above, the locked portions 35 are formed as the depressions in the optical waveguide 20. However, as shown in FIGS. 14 and 15, the locked portions 35 can also be formed as, e.g., circular holes extending through the underclad layer 21 and the overclad layer 23 in the thickness direction thereof, and located between the respective both widthwise outer end surfaces of the underclad layer 21 and the overclad layer 23 and the both widthwise outer end surfaces of the core layer 22 (widthwise midway).

In that case, it is also possible to provide a reinforcing plate having the same width as that of the optical waveguide 20 on the surface (the lower surface of the underclad layer 21 and/or the upper surface of the overclad layer 23) of the optical waveguide 20 as necessary, and form reinforcing circular holes extending through the reinforcing plate in the thickness direction thereof at the same positions as those of the circular holes in the underclad layer 21 and the overclad layer 23 when viewed in plan view.

Figure 14:
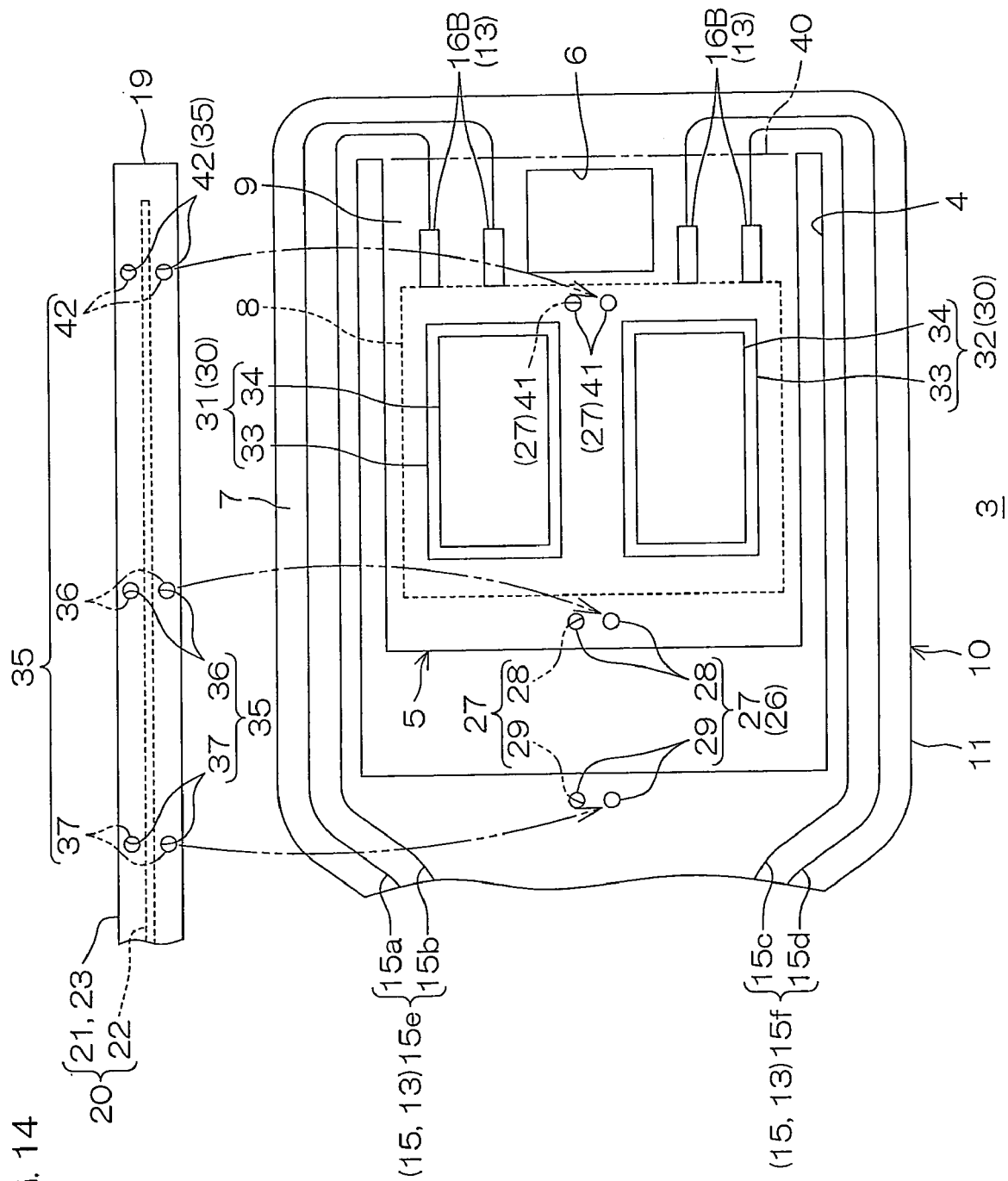
FIG. 14 is an enlarged plan view of the gimbal of the suspension board with circuit according to yet another embodiment (in which the locked portions are each formed of a circular hole, and the locking portions are each formed as a through hole) of the present invention.
Figure 15:
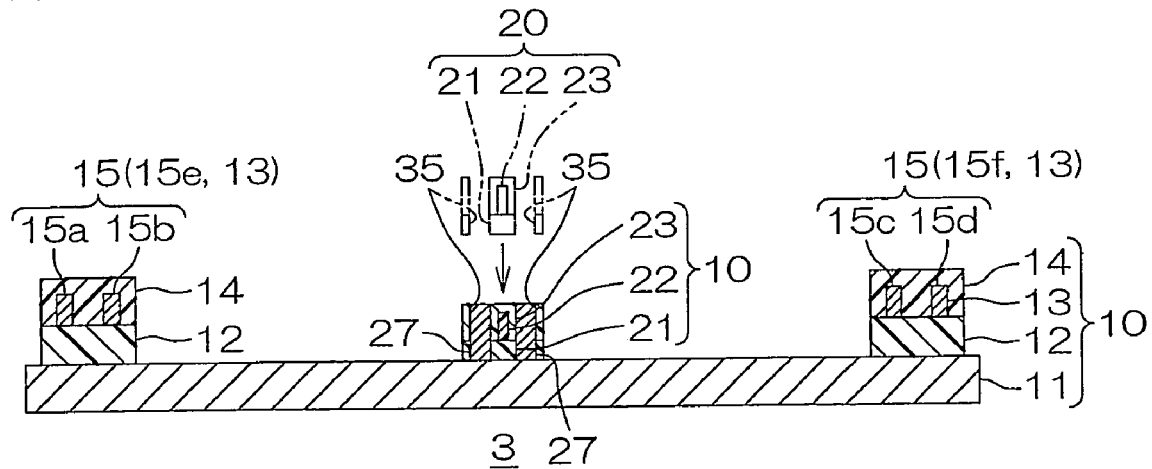
FIG. 15 shows the suspension board with circuit according to the yet another embodiment (in which the locked portions are each formed as the circular hole) of the present invention, and is a cross-sectional view corresponding to FIG. 5.
Figure 16:
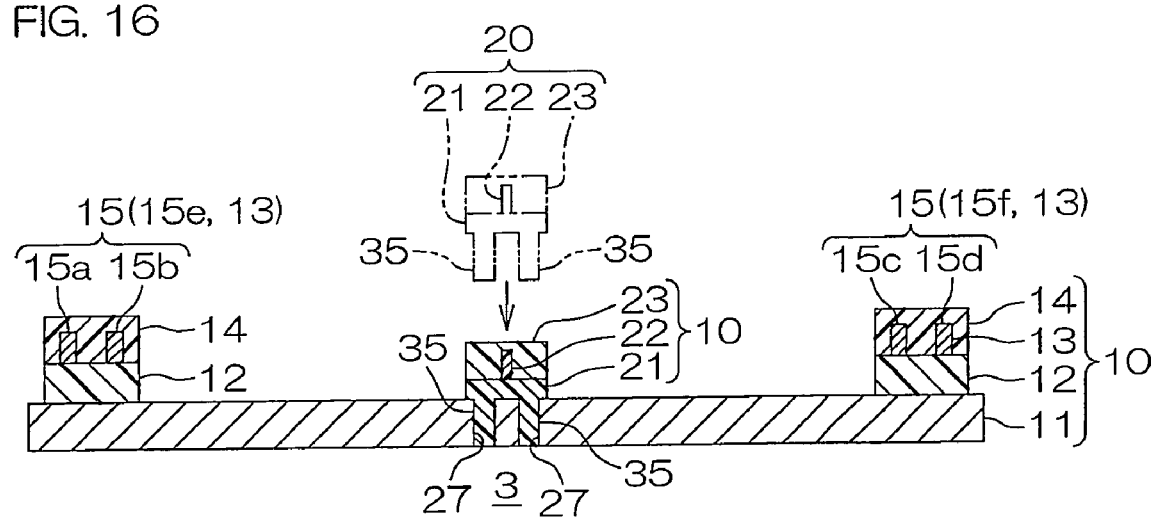
FIG. 16 is an enlarged plan view of the gimbal of the suspension board with circuit according to the yet another embodiment (in which the locking portions are each formed as the through hole) of the present invention.

Further, as shown in FIG. 14 (the leading lines indicated by the imaginary lines) and FIG. 16, it is also possible to form the locked portions 35 as projections which downwardly project from the lower surface of the underclad layer 21, and form the locking portions 27 as fitting holes (through holes) into which the projections of the locked portions 35 are to be fitted, and which extend through the metal supporting board 11 in the thickness direction thereof.

In the description given above, the pedestals 30 are each formed of the pedestal insulating base layer 33 and the pedestal conductive layer 34. However, the pedestals 30 can also be each formed of, e.g., at least one layer selected from the group consisting of the pedestal insulating base layer 33, the pedestal conductive layer 34, and the pedestal insulating cover layer (with the exception of two layers made of the pedestal insulating base layer 33 and the pedestal conductive layer 34), though not shown.

Figure 17:
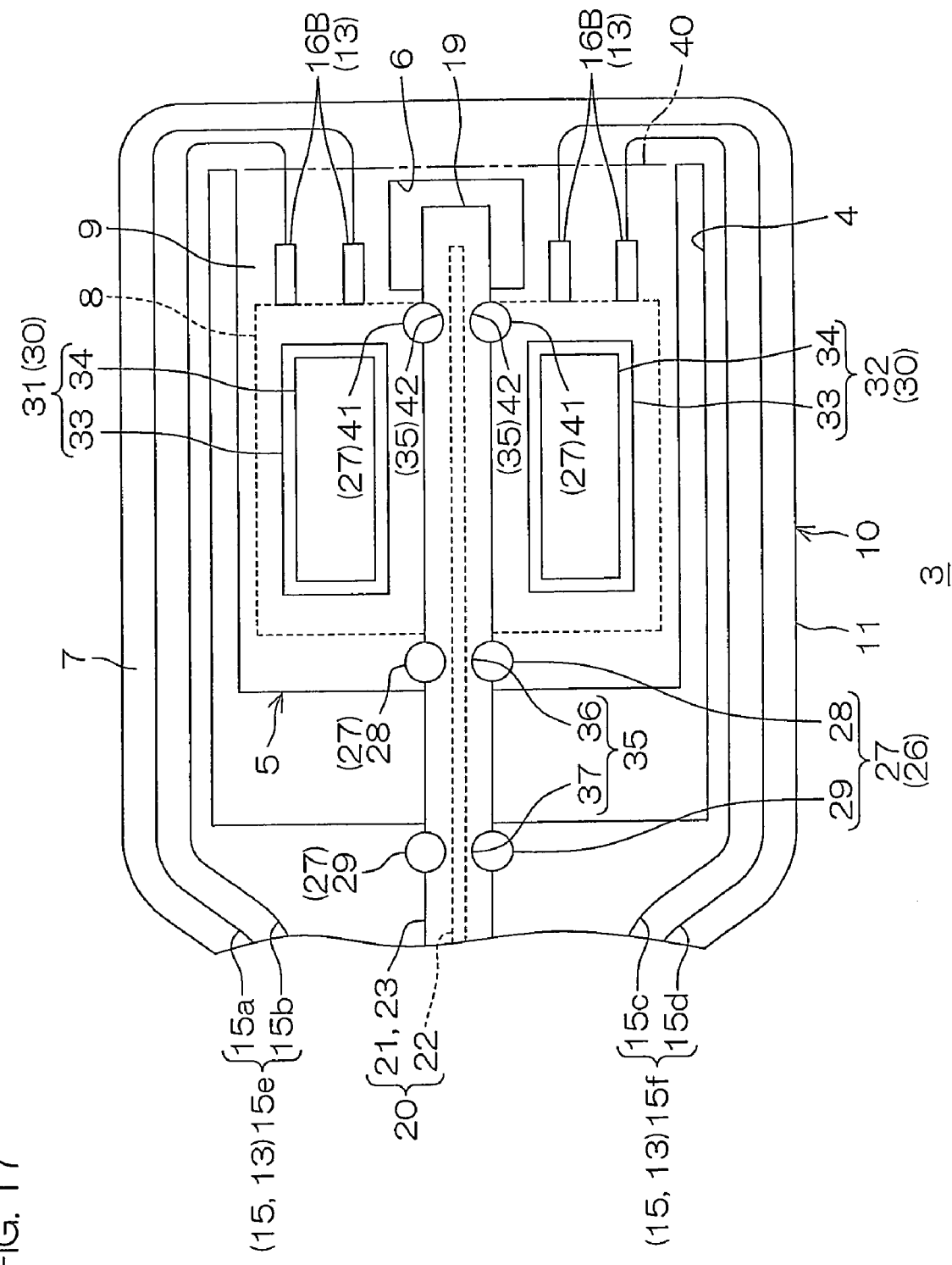
FIG. 17 is an enlarged plan view of the gimbal of the suspension board with circuit according to still another embodiment (in which pedestals are disposed to be spaced apart from the optical waveguide) of the present invention.

In the description given above, the pedestals 30 are disposed to be in contact with the optical waveguide 20. However, as shown in FIG. 17, it is also possible to, e.g., dispose the pedestals 30 such that the first pedestal 31 and the second pedestal 32 are widthwise spaced apart from the optical waveguide 20.

In the description given above, the first pedestal 31 and the second pedestal 32 are each formed in a generally rectangular plan view shape. However, each of the first pedestal 31 and the second pedestal 32 can also be formed in an appropriate shape such as, e.g., a circular plan view shape, though not shown.

In the description given above, the pedestals 30 are disposed such that the optical waveguide 20 passes under the slider 24 (through the mounting portion 8) when viewed in plan view. However, the pedestals 30 can also be disposed such that the front end surface of the optical waveguide 20 reaches a longitudinally middle portion of the slider 24 when viewed in plan view.

Figure 18:
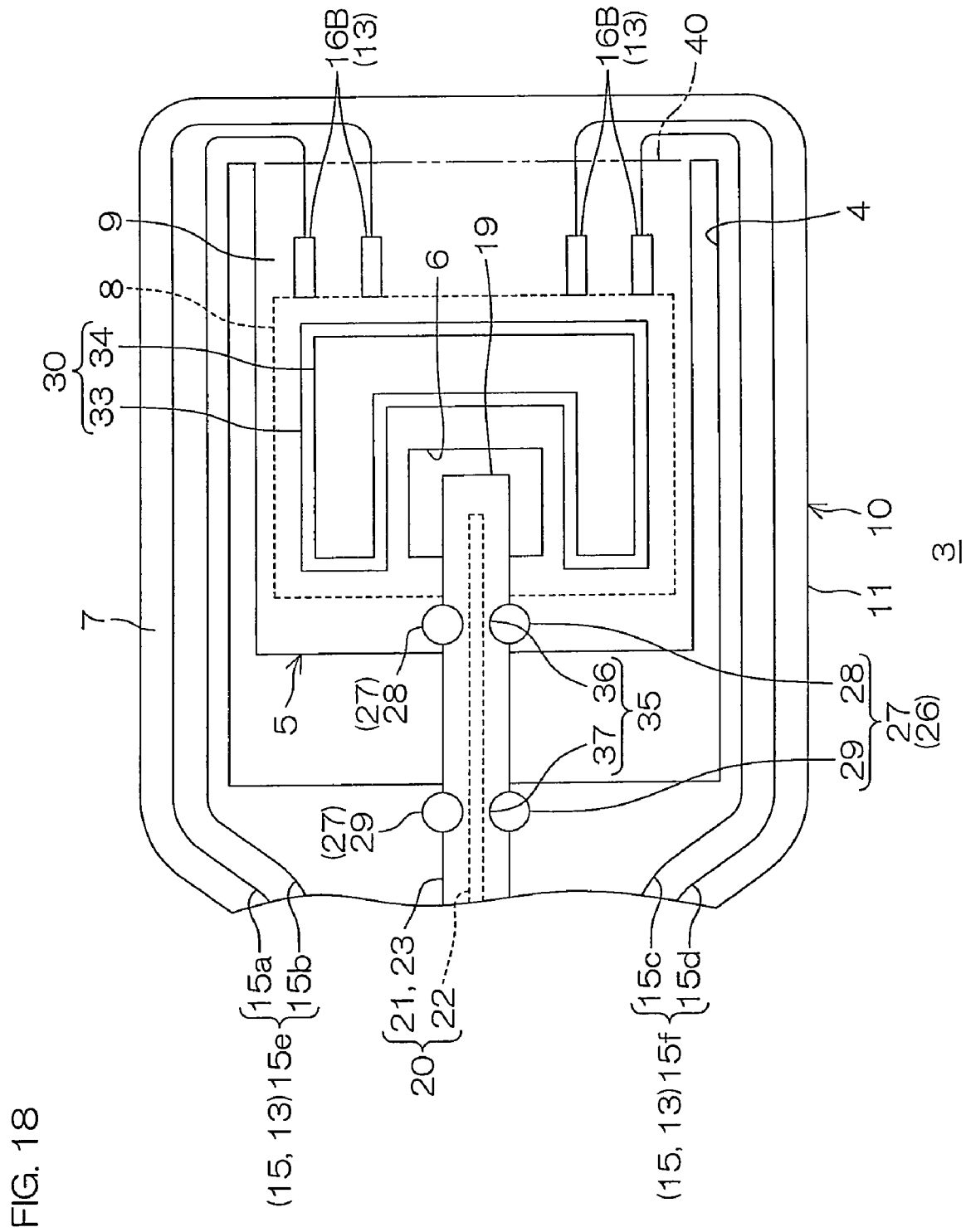
FIG. 18 is an enlarged plan view of the gimbal of the suspension board with circuit according to yet another embodiment (in which the front end surface of the optical waveguide reaches a longitudinally middle portion of a slider) of the present invention.
Figure 19:
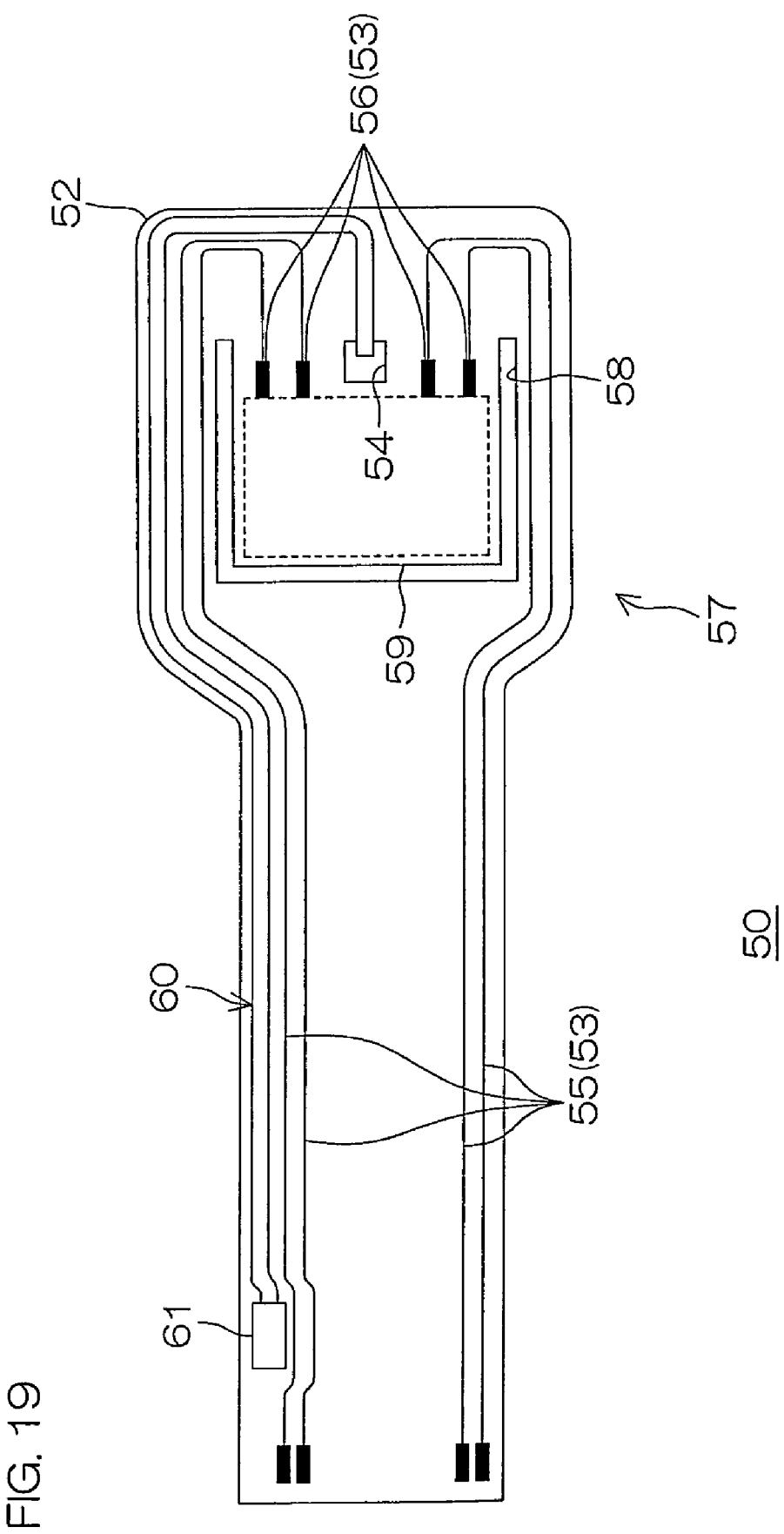
FIG. 19 is a plan view (in an embodiment in which an optical waveguide passes around a slit portion) of a suspension board with circuit.

In FIG. 18, the pedestals 30 are each formed in a generally U-shaped shape which rearwardly opens when viewed in plan view.

The locking portions 27 are each formed only of the first locking portion 28 and the second locking portion 29, while the locked portions 35 are each formed only of the first locked portion 36 and the second locked portion 37.

The emission opening 6 is formed at the center of the mounting portion 8 in the front-to-rear direction. The emission opening 6 is disposed widthwise inward of the pedestals 30 which are arranged in widthwise opposing relation to be widthwise spaced apart from the pedestals 30.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:
1. A suspension board with circuit comprising:
  a circuit board formed with an opening, and having a mounting portion defined by the opening for mounting thereon a slider on which a magnetic head is mounted; and an optical waveguide disposed on the circuit board so as to traverse the opening, wherein
the optical waveguide is slack in the opening.

2. The suspension board with circuit according to claim 1, wherein
the circuit board includes locking portions for locking the optical waveguide which are formed on both sides of the opening interposed therebetween,
the optical waveguide is provided with respective locked portions to be locked by the respective locking portions, and
a distance between the two locking portions formed on both sides of the opening is shorter than a distance between the two locked portions corresponding to the two locking portions.

3. A producing method of a suspension board with circuit, the producing method comprising:
preparing a circuit board formed with an opening, and having a mounting portion defined by the opening for mounting thereon a slider on which a magnetic head is mounted;
preparing an optical waveguide; and
disposing the optical waveguide on the circuit board such that the optical waveguide traverses the opening, wherein,
in the step of preparing the circuit board, locking portions for locking the optical waveguide are formed on both sides of the opening interposed therebetween,
in the step of preparing the optical waveguide, respective locked portions to be locked by the respective locking portions are provided such that a distance between the two locking portions formed on both sides of the opening is shorter than a distance between the two locked portions corresponding to the two locking portions, and,
in the step of disposing the optical waveguide, the respective locked portions are locked by the respective locking portions, while the optical waveguide between the two locked portions corresponding to the two locking portions formed on both sides of the opening is slackened.

\* \* \* \* \*